United States Patent

Dohjo et al.

[11] Patent Number: 5,835,177
[45] Date of Patent: Nov. 10, 1998

[54] ARRAY SUBSTRATE WITH BUS LINES TAKEOUT/TERMINAL SECTIONS HAVING MULTIPLE CONDUCTIVE LAYERS

[75] Inventors: Masayuki Dohjo; Hideo Kawano; Akira Kubo; Makoto Shibusawa; Tetsuya Iizuka; Tamio Nakai; Kazushige Mori, all of Tokyo, Japan

[73] Assignee: Kabushiki Kaisha Toshiba, Kawasaki, Japan

[21] Appl. No.: 726,472

[22] Filed: Oct. 4, 1996

[30] Foreign Application Priority Data

Oct. 5, 1995 [JP] Japan .................................. 7-258615
Oct. 5, 1995 [JP] Japan .................................. 7-258619
Oct. 5, 1995 [JP] Japan .................................. 7-258629

[51] Int. Cl.⁶ .................. G06F 1/1343; G06F 1/1345; H01L 29/04
[52] U.S. Cl. .................. 349/147; 349/152; 349/139; 257/59
[58] Field of Search .................. 349/147, 149, 349/139, 152; 257/59

[56] References Cited

U.S. PATENT DOCUMENTS

| 4,621,260 | 11/1986 | Suzuki et al. | 340/719 |
| 5,187,604 | 2/1993 | Taniguchi et al. | 349/147 |
| 5,264,728 | 11/1993 | Ikeda et al. | 349/147 |
| 5,428,250 | 6/1995 | Ikeda et al. | 349/147 |
| 5,483,082 | 1/1996 | Takizawa et al. | 257/59 |
| 5,488,498 | 1/1996 | Fujii et al. | 349/149 |
| 5,499,131 | 3/1996 | Kim | 349/149 |
| 5,748,179 | 5/1998 | Ito et al. | 349/149 |

FOREIGN PATENT DOCUMENTS 1-243031  9/1989  Japan ..................... 349/147

Primary Examiner—William L. Sikes
Assistant Examiner—Toan Ton
Attorney, Agent, or Firm—Pillsbury Madison & Sutro LLP

[57] ABSTRACT

An array substrate includes plural scanning lines (111); a thin film transistor (112) having a first dielectric film (115), (117), a semiconductor film (120) thereon, and a source electrode (126b) electrically coupled to the semiconductor film (120) and a drain electrode (126a); a signal line (110) as taken out of the drain electrode (126a) to extend at substantially right angles to the scanning lines (111); and a pixel electrode (131) electrically connected to the source electrode (126b), wherein the pixel electrode (131) is electrically connected to the source electrode (126b) through a second dielectric film (127) as disposed on at least the signal line (110) while the pixel electrode (131) overlaps an elongate region (113) from its neighboring scanning line (111) through the first and second dielectric films (115), (117), (127). With such an arrangement, an appropriate storage capacitor can be formed by causing the scanning lines and pixel electrode to overlap each other without having to decrease the manufacturing yield while enabling achievement of high aperture ratio.

4 Claims, 23 Drawing Sheets

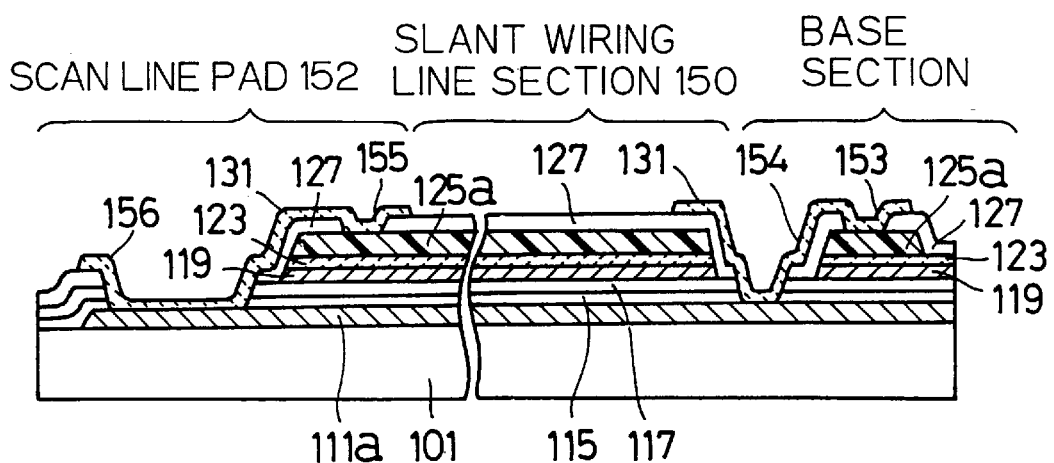
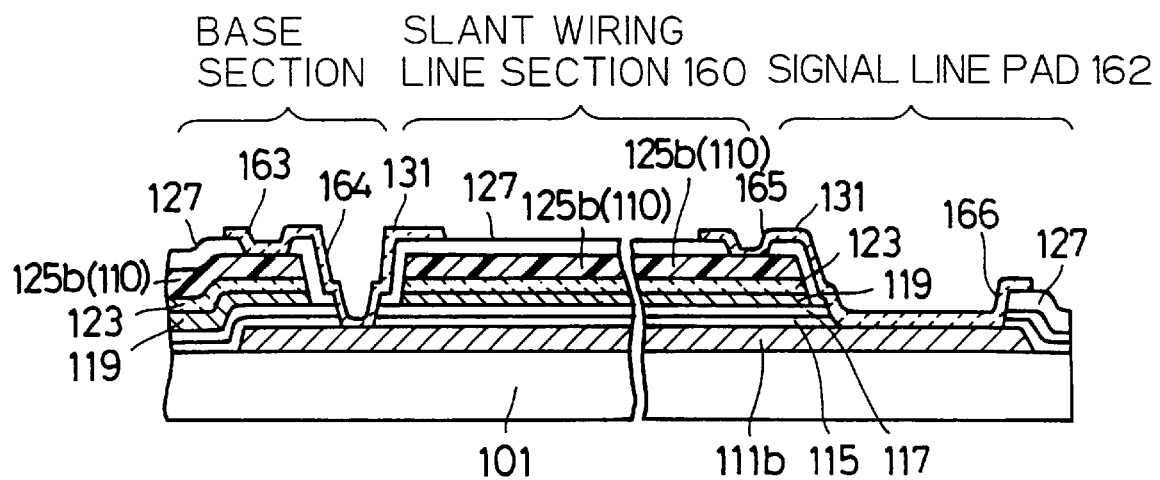

LINE A-A' CROSS-SECTION

LINE D-D' CROSS-SECTION

5,835,177

ARRAY SUBSTRATE WITH BUS LINES TAKEOUT/TERMINAL SECTIONS HAVING MULTIPLE CONDUCTIVE LAYERS

TECHNICAL FIELD

The present invention relates to array substrates for use in flat panel display devices including liquid crystal display (LCD) devices and the manufacturing method thereof.

BACKGROUND ART

In the recent years flat panel display devices are more frequently developed to replace conventional cathode-ray tube (CRT) units; in particular, LCD devices are becoming commercially attractive more and more due to their advantage such as light weight, thinness, low power consumption and the like.

As one typical prior known LCD devices, an light transmissive active-matrix LCD device will now be described herein which comes with a plurality of switch elements each of which is at a respective one of picture elements. The active-matrix LCD device includes a liquid crystal layer as held between an array substrate and a opposed substrate with orientation films being provided between the liquid crystal layer and any one of such substrates. The array substrate has, on a transparent insulative substrate made of glass, quartz or the like, a plurality of signal lines and a scanning lines arranged in a matrix form. At each of such crosspoints, a thin film transistor (abbreviated to "TFT" hereinafter) made of semiconductor thin film such as amorphous silicon (referred to as "a-Si:H") is connected to the lines. TFT has a gate electrode electrically connected to a corresponding one of the scanning lines, a drain electrode electrically connected to a corresponding signal line, and a source electrode electrically connected to a transparent conductive material constituting an associated pixel electrode, which material may be indium-tin-oxide (ITO).

The opposed substrate is constituted from a glass substrate on which an opposed electrode made of ITO is disposed; where displaying of color images is required, a color filter layer will be additionally provided thereon.

OBJECT OF THE INVENTION

Incidentally, in the aforesaid LCD device, the pixel electrode can vary in potential due to presence of inherent parasitic capacitances at TFTs or occurrence of leak currents between pixel electrodes and the opposed electrode; in order to suppress such potential variations at pixel electrodes, it has been well known that a storage capacitor line is employed which overlies an associative pixel electrode with an insulative film laid therebetween thus providing a storage capacitor (Cs) coupled in parallel with the pixel electrode capacitance (CLc).

Unfortunately, such storage capacitor line is typically made of optical nontransmissive or opaque materials exhibiting impermeability against light rays, which are generally employed for scanning lines also, in order to eliminate an increase in number of manufacturing process steps required. The use of such materials may adversely serve to reduce the aperture ratio. This can be said because, obviously, any regions for disposal of the storage capacitor lines exhibit optical impermeability.

In view of the foregoing, it has been proposed that the storage capacitor is formed between the pixel electrode and one scanning line neighboring thereto while specifically designing the scanning pulses being applied to scanning lines, thereby enabling attainment of higher aperture ratio with pixel potential variations being minimized (U.S. Pat. No. 4,621,260).

However, such structure does not come without accompanying a problem: electrical interlayer short-circuiting can arise at any overlap sections between scanning lines and pixel electrodes, which in turn leads to a reduction in manufacturing yield.

Another advantage of the prior known structure is that while the pixel area contributing display performance of the pixel electrode can be well defined by carefully designing the shape of scanning lines in such a way as to overlie or "overlap" the periphery of pixel electrode, the storage capacitor (Cs)—this is formed by the overlap region of each pixel electrode and its associated scanning line—can also increase in value to go beyond an optimal capacitance value as required to suppress pixel potential variations. Accordingly, this results in a delay in transmission of scanning pulse signals causing data write into such pixel electrode to become insufficient or causing the contrast ratio to decrease. If this is the case, the aperture ratio will decrease.

The present invention has been made by taking the foregoing technical problems into consideration, and relates to an array substrate for use in display devices arranged to form a storage capacitor by causing scanning lines and pixel electrodes to overlap each other. Accordingly, it is an object of the invention to provide an array substrate for display devices and the manufacturing method thereof capable of improving manufacturing yield while enabling accomplishment of high aperture ratio.

It is another object of the instant invention to provide an array substrate for display devices and the manufacturing method thereof capable of attaining high productivity by use of a decreased number of masks without having to decrease yield of production.

It has been provided an array substrate for display devices and the manufacturing method thereof capable of attaining high productivity without decreasing production yield (U.S. Pat. No. 5,483,082). The array substrate as disclosed therein is structured as set forth below.

A gate terminal section consists of a lower gate terminal electrode, and an upper gate terminal electrode which is laminated on the lower electrode with a dielectric film—this constitutes a common layer with a gate insulator film—and a passivation film being sandwiched therebetween and connected together with the lower electrode via more than one contact hole as formed in these films. A storage capacitor section is arranged so that it includes a Cs electrode, a dielectric film consisting of an insulator film on Cs electrode and a semiconductor film, and an opposed electrode thereon consisting of a n+ type doped semiconductor layer and a metal layer.

The prior art array-substrate structure suffers from a problem in that when a voltage is to be applied to such storage capacitor section, it becomes difficult to apply the same voltage to a plurality of storage capacitor sections.

In light of the above problem, the present invention provides an array substrate as structured to enable the same voltage to be applied to a respective one of the storage capacitor sections.

DISCLOSURE OF THE INVENTION

The invention as recited in claim 1 provides an array substrate for a display device comprising a scanning line on a substrate; a thin film transistor having a first insulator film on said scanning line, a semiconductor film thereon, and a source electrode and a drain electrode electrically connected to said semiconductor film; a signal line as taken out of the drain electrode to extend substantially perpendicularly to said scanning line; and a picture element or "pixel" electrode electrically connected to the source electrode, wherein said pixel electrode is electrically coupled to said source electrode through a second insulator film as disposed at least on the signal line, and in that said pixel electrode overlaps said scanning line neighboring thereto with the first and second insulator films being laid therebetween.

The invention according to claim 4 provides a method of manufacturing an array substrate for a display device including a scanning line on a substrate, a thin film transistor having a first insulator film on said line, a semiconductor film thereon, a channel protective film on said semiconductor film, and source and drain electrodes electrically connected to said semiconductor film, a signal line as taken out of the drain electrode to extend substantially perpendicularly to said scanning line, and a pixel electrode electrically connected to the source electrode, said method comprising the steps of: forming a first wiring line layer including said scanning line on said substrate; depositing said first insulator film and a semiconductor coated film; forming a second wiring line layer including said signal line, said source electrode and said drain electrode by patterning at least said metal thin film and said semiconductor film with the same mask used; depositing a second insulator film to form a first contact hole in said second insulator film corresponding to said source electrode; and forming said pixel electrode being electrically connected to said source electrode through said contact hole and overlapping said scanning line with the first and second insulator films being laid therebetween.

In accordance with the array substrate and the manufacturing method thereof, since at least the pixel electrode is disposed through the dielectric film(s) with respect to the scanning line and signal line, it becomes possible to locate the pixel electrode sufficiently close to such scanning and signal lines thereby enabling accomplishment of high aperture ratio. Further, the pixel electrode for example is specifically disposed so as to overlap an elongate region as extended from one neighboring scanning line with at least two, first and second dielectric films being laid therebetween; accordingly, even when the overlap region with the pixel electrode increases in area, it will no longer happen that the manufacturing yield is decreased due to occurrence of electrical insulation defects.

Furthermore, with the foregoing arrangement, even on occasions where the overlap region between the pixel electrode and its associative scanning line increases in area, it is possible to suppress or eliminate a significant increase in storage capacitor. More specifically, where the storage capacitor is formed by causing the scanning line and pixel electrode to overlap each other, it will possibly happen that if the storage capacitor is sufficiently great in value, resultant capacitance addition relating to the scanning line increases which in turn leads to an increase in power consumption or to degradation in display performance such as insufficient writing or a decrease in contrast ratio due to a delay in scanning pulse signals. Fortunately, with this invention, even when the periphery of pixel electrode and the elongate region of scanning line are designed to overlap each other in order to define a boundary of pixel electrode for example, the storage capacitor will no longer increase significantly because of the fact that the pixel electrode overlaps the elongate region extended from scanning line with at least two, first and second dielectric films being sandwiched therebetween.

The invention as defined in claim 9 provides a method of manufacturing an array substrate for a display device including a scanning line on a substrate, a thin film transistor having a first insulator film on said line, a semiconductor film thereon, source and drain electrodes electrically connected to said semiconductor film, a signal line as taken out of the drain electrode to extend substantially perpendicularly to said scanning line, and a pixel electrode electrically connected to the source electrode, comprising a first step of forming said scanning line, a second step of depositing said first insulator film and a semiconductor coated film, a third step of depositing a metal thin film to form said signal line, the source electrode and the drain electrode by patterning said metal thin film and said semiconductor film using the same mask, a fourth step of depositing a second insulator film to form a first contact hole in said second insulator film corresponding to said source electrode, and a fifth step of forming said pixel electrode being electrically coupled though said contact hole to said source electrode and overlapping said scanning line with the first and second insulator films being laid therebetween, wherein, at a place excluding said thin film transistor and bridging said pixel electrode and the one neighboring scanning line or another scanning line, the method further comprises the steps of depositing said first insulator film and a semiconductor coated film simultaneously with said second step, forming said light shield layer by depositing said metal thin film and patterning said metal thin film and said semiconductor film by use of said mask simultaneously with said third step, depositing said second insulator film simultaneously at said fourth step, and forming said pixel electrode so as to overlap part of the one scanning line or another scanning line simultaneously with said fifth step.

The invention of claim 10 provides an array substrate for a display device comprising a plurality of scanning line being disposed on a substrate and including a gate electrode region, storage capacitor lines extending in substantially parallel with said scanning lines, a thin film transistor having a first insulator film on said storage capacitor lines, a semiconductor film disposed on at least said gate electrode region, and source and drain electrodes electrically connected to said semiconductor film, a second insulator film on said thin film transistor, a signal line electrically connected to the drain electrode through said second insulator film and intersecting substantially perpendicularly to said scanning lines, and a pixel electrode electrically connected to the source electrode through said second insulator film, wherein each of said storage capacitor line includes a bundling lead member extending in a direction substantially perpendicular to each of said storage capacitor lines with the first and second insulator films being laid therebetween, and that each of said storage capacitor lines and said bundling lead member include a storage capacitor coupler section electrically connected through a conductive layer.

The invention set forth in claim 14 provides an array substrate for a display device having a scanning line on a substrate, a thin film transistor having a first insulator film on said line, a semiconductor film thereon, and source and drain electrodes electrically connected to said semiconductor film, a signal line as taken out of the drain electrode to extend substantially perpendicularly to said scanning line, and a pixel electrode electrically connected to the source electrode, comprising a scanning-line takeout section being provided at a scanning-line terminal section located at periphery of said substrate, for taking out said scanning line, wherein said scanning-line takeout section has a first conductive layer being the same in material as said scanning line, and a second conductive layer being the same in material as the signal line and being provided on said first conductive layer with an insulative layer being sandwiched therebetween, wherein said first conductive layer and said second conductive layer are electrically connected together by a connection layer same in material as said pixel electrode.

The invention as defined in claim 15 provides an array substrate for a display device having a scanning line on the substrate, a thin film transistor having a first insulator film on said line, a semiconductor film thereon, and source and drain electrodes electrically connected to said semiconductor film, a signal line as taken out of the drain electrode to extend substantially perpendicularly to said scanning line, and a pixel electrode electrically connected to the source electrode, comprising a signal-line takeout section for taking out the signal line as provided at a signal-line terminal section located at periphery of said substrate, wherein said signal-line takeout section has a first conductive layer same in material as said scanning line, and a second conductive layer being the same in material as the signal line and being provided on said first conductive layer with an insulative layer being sandwiched therebetween, said first conductive layer and said second conductive layer being electrically connected together by a connection layer same in material as said pixel electrode.

The invention set forth in claim 16 provides an array substrate for a display device comprising a scanning line on a substrate, a thin film transistor having a first insulator film on said line, a semiconductor film thereon, and source and drain electrodes electrically connected to said semiconductor film, a second insulator film on said thin film transistor, a signal line extending substantially perpendicularly to said scanning line as electrically connected through said second insulator film to the drain electrode, a pixel electrode electrically connected through said second insulator film to the source electrode, a signal line terminal section electrically connected through a signal line takeout section to said signal line, and a scanning line terminal section electrically connected through a scanning line takeout section to said scanning line, wherein said signal line terminal section and scanning line terminal section comprise a first conductive layer same in material as said scanning line, and a second conductive layer same in material as said pixel electrode and being disposed on said first conductive layer.

BRIEF DESCRIPTION OF THE DRAWINGS

FIG. 3 is a schematic cross-section of the liquid crystal display device taken along line B–B' in FIG. 1.

FIG. 4 is a schematic cross-section of the liquid crystal display device taken along line C–C' in FIG. 1.

BEST MODE EMBODYING THE INVENTION

First Embodiment

A description will now be given of a liquid crystal display (LCD) device (1) in accordance with a first embodiment of the present invention with reference to FIGS. 1 through 13.

Figure 2:
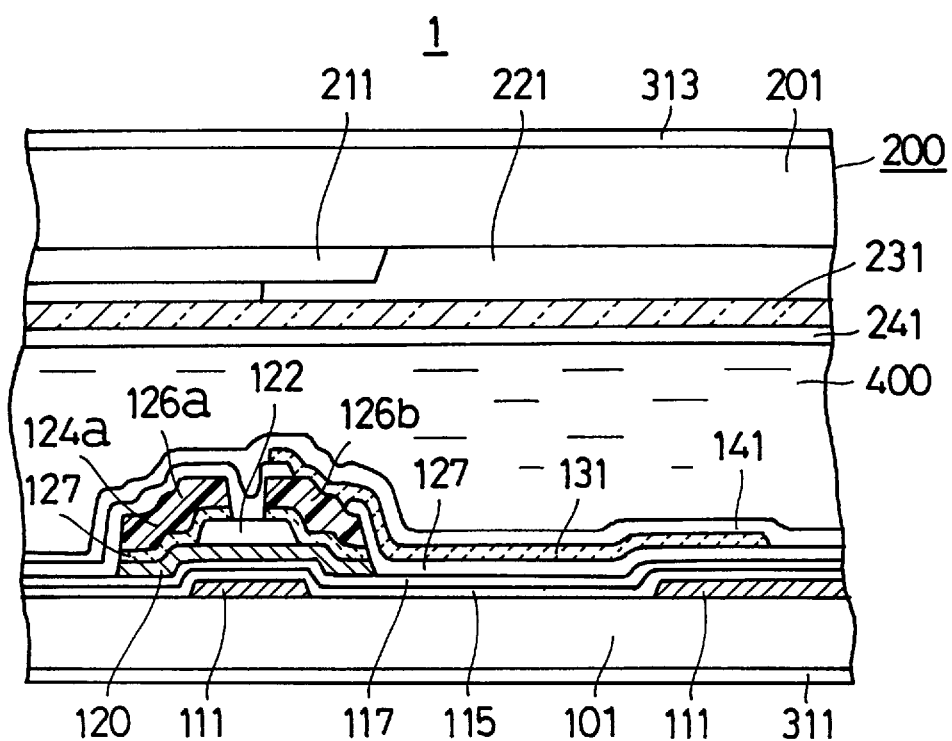
FIG. 2 is a schematic cross-section of the liquid crystal display device taken along line A–A' in FIG. 1.

This LCD device (1) is of the light transmissive type capable of displaying color images. As shown in FIG. 2, LCD device (1) has an array substrate (100), an opposed substrate (200), and a twisted nematic (TN) liquid crystal held therebetween through orientation films (141) being laid between it and substrates (100), (200). These orientation films (141), (241) are made of polyimide resin. Also, polarization plates (311), (313) are adhered to the outer surfaces of array substrate (100) and opposed substrate (200), respectively.

Figure 1:
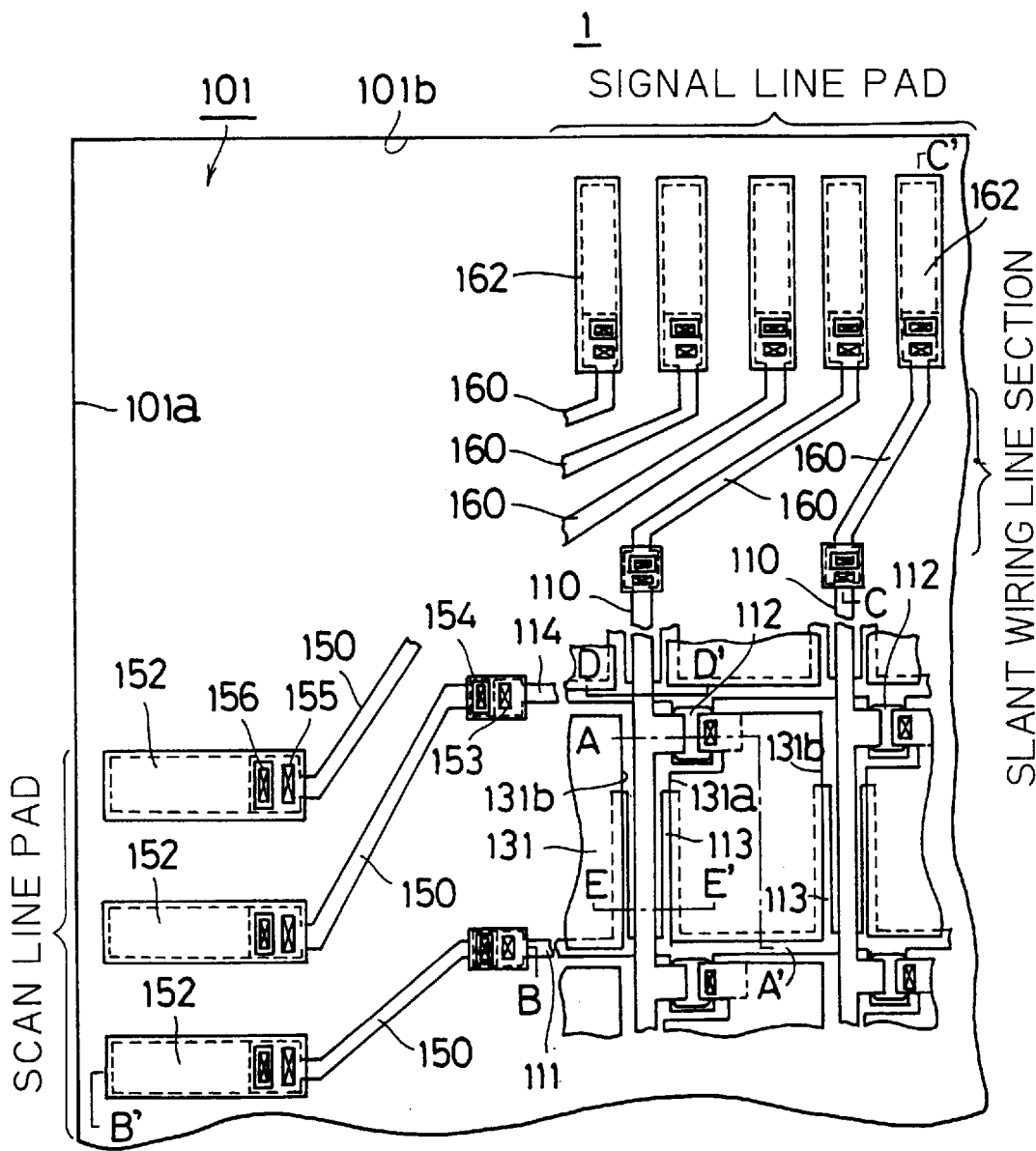
FIG. 1 is a diagram schematically showing a plan view of part of an array substrate in accordance with one preferred embodiment of the present invention.

FIG. 1 shows a schematical plan view of the array substrate (100), wherein the lower side of this drawing is to be located at the upper side of the display screen of LCD device (1) while allowing scanning lines to be successively selected in the sequence from the lower to the upper side of the illustration.

The array substrate (100) includes 480 scanning lines (111) made of aluminum-yttrium (Al—Y) alloy as disposed on a glass substrate (101). One end of each scanning line (111) is taken out to extend toward one edge (101a) side of the glass substrate (101), and is electrically connected through a slant wiring line section (150) to a corresponding one of scanning line connection pads (152). Here, the scanning lines (111) are made of Al—Y alloy; these may alternatively be made of molybdenum-tantalum (Mo—Ta) alloy, molybdenum-tungsten (Mo—W) alloy, aluminum (Al), or its alloy.

The array substrate (100) also includes 1,920 signal lines (110) made of Mo—W alloy, which lines extend to intersect the scanning lines (111) at substantially right angles on the glass substrate (101). Each signal line (110) is taken out to run toward the other edge (101b) side of the glass substrate (101), and is electrically connected via a slant wiring line section (160) to a corresponding signal line connection pad (162). While signal lines (110) are made of Mo—W alloy here, these may alternatively be constituted from Mo—Ta alloy, Al or its alloy.

A TFT (112) is disposed near each of the cross-points of the scanning lines (111) and signal lines (110). Also, a pixel electrode (131) which is made of ITO and coupled to TFT (112) is disposed over the scanning line (111) and signal line (110) with an interlayer dielectric film (127) being provided therebetween. This interlayer dielectric film (127) may be an inorganic dielectric film made of silicon nitride, silicon oxide or the like, or an organic resin coated film of acryl-based material; preferably, the interlayer dielectric film is constituted from a multi-layer film of a combination of such inorganic dielectric film and organic resin coated film thereby further improving the surface flatness and interlayer dielectricity.

(Structure of TFT Region)

An explanation will be given of the structure of TFT (112).

Figure 6:
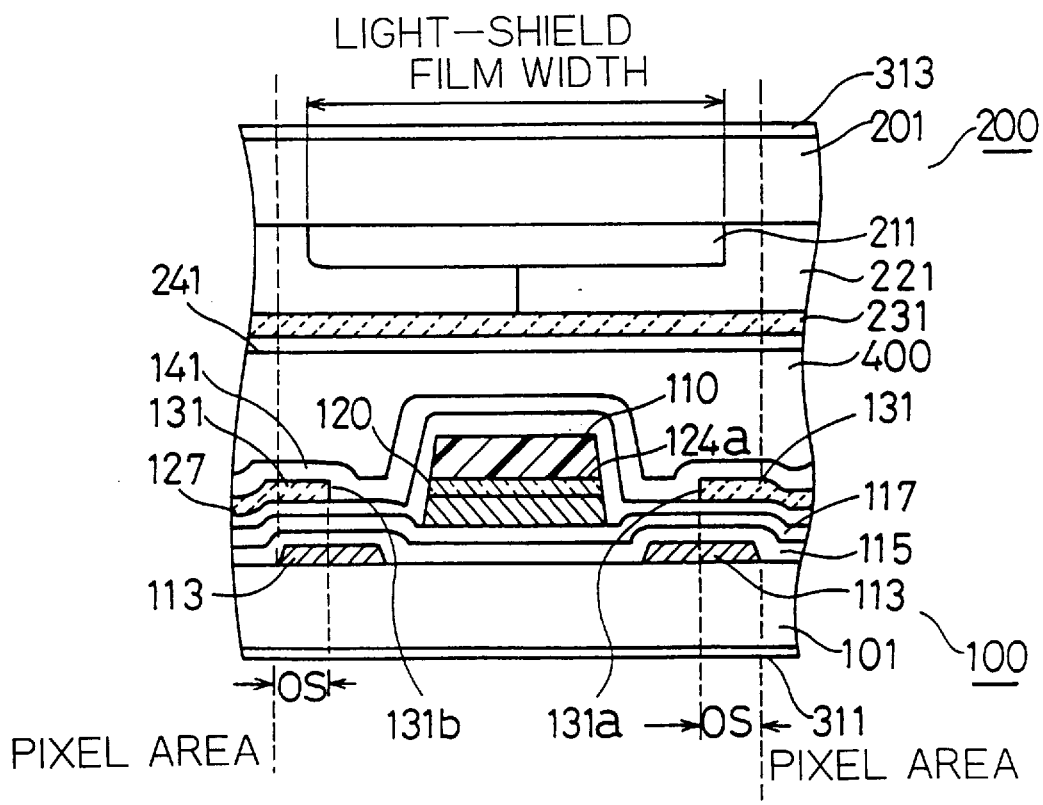
FIG. 6 is a schematic cross-section of the liquid crystal display device taken along line E–E' in FIG. 1.

Each scanning line (111) includes a fine strip-shaped elongate region (113) extending along the signal line (110) to overlap the edges (131a), (131b) of one neighboring pixel electrode (131). As shown in FIG. 6, the pixel electrode (131) and the elongate region (113) from a prestage-in-scanning line (111) with respect to the scanning line (111) for the pixel electrode (131) overlap each other at certain overlap region (OS), with a first gate insulator film (115), a second gate insulator film (117) and interlayer dielectric film (127) being laid therebetween, causing such overlap region (OS) to constitute a storage capacitance (Cs). Further, with this embodiment, the pixel electrode (131) overlaps the prestage scanning line (111) per se through the first gate insulator film (115), second gate insulator film (117) and interlayer dielectric film (127) to form a further overlap region which also constitutes the storage capacitor (Cs).

The opposed substrate (200) opposing this array substrate (100) is disposed on a glass substrate (201), and includes a matrix-shaped light shielding film (211) made of a chosen resin material which acts to block any incoming light rays by way of the TFT (121) region and gap spacings between the pixel electrode (131) and any one of signal lines (110) and scanning lines (111). A color filter (221) having three color components of red (R), green (G) and blue (B) is disposed in a certain region corresponding to the pixel electrode (131). Provided on this is another opposed electrode (231) made of a transparent conductive material.

With the array substrate (100) of this LCD device (1) thus arranged, since the interlayer dielectric film (127) alone or both the first and second gate insulator films (115), (117) and interlayer dielectric film (127) are disposed between the pixel electrode (131) and any one of signal lines (110) and scanning lines (111), it is possible for pixel electrode (131) to be disposed sufficiently close to or over respective wiring lines (110), (111), thereby enabling achievement of increased aperture ratio.

Another advantage of the illustrative embodiment is that since the storage capacitor (Cs) is formed between the pixel electrode (131) and the elongate region (113) extended from one scanning line (111) neighboring to such pixel electrode (131), it is no longer necessary to employ any extra storage capacitor wiring lines enabling achievement of further increased aperture ratio. Especially, in this embodiment, because TFT (112) is constituted using as its gate electrode a specific region taken out of the signal line (110) to extend along the signal line (110), it becomes possible for pixel electrode (131) to overlap the prestage scanning line (111) per se. This may advantageously serve to attain sufficient storage capacitor (Cs) while enabling achievement of high aperture ratio.

Also, since three kinds of insulative or dielectric films (115), (117), (127) are laminated and disposed between the pixel electrode (131) and the scanning line (111) and between the pixel electrode (131) and elongate region (113), it is possible to successfully suppress occurrence of electrical interlayer shorting due to the inherent structure of the embodiment.

Incidentally, in this embodiment, the pixel area is defined in planar size not by the light-shield film (211) as disposed on the opposed electrode (200), but by the scanning line (111) and its elongate region (113) on the array substrate (100). Accordingly, the alignment accuracy of the product is dependent solely upon an alignment accuracy of a first mask pattern for use in patterning scanning lines (111) to a fifth mask pattern for patterning pixel electrodes (131), rather than depending on an alignment accuracy of the array substrate (100) to opposed substrate (200). This may avoid the need to add extra margins to the width of light shield film (211) in view of possible alignment variations of the array substrate (100) to opposed substrate (200), thus enabling accomplishment of further increased aperture ratio.

Yet another advantage of the embodiment is that even when the elongate region (113) of scanning line (111) is fully extended along the edges (131a), (131b) of pixel electrode (131) along the signal line (110) in order to define the boundary of pixel area, it is possible to suppress or eliminate an excessive increase in storage capacitor (Cs) without degrading the productivity. This can be said because the interlayer dielectric film (127) is disposed-in addition to the first gate insulator film (115) and second gate insulator film (117)—between the pixel electrode (131) and the elongate region (113) of scanning line (111).

Figure 5:
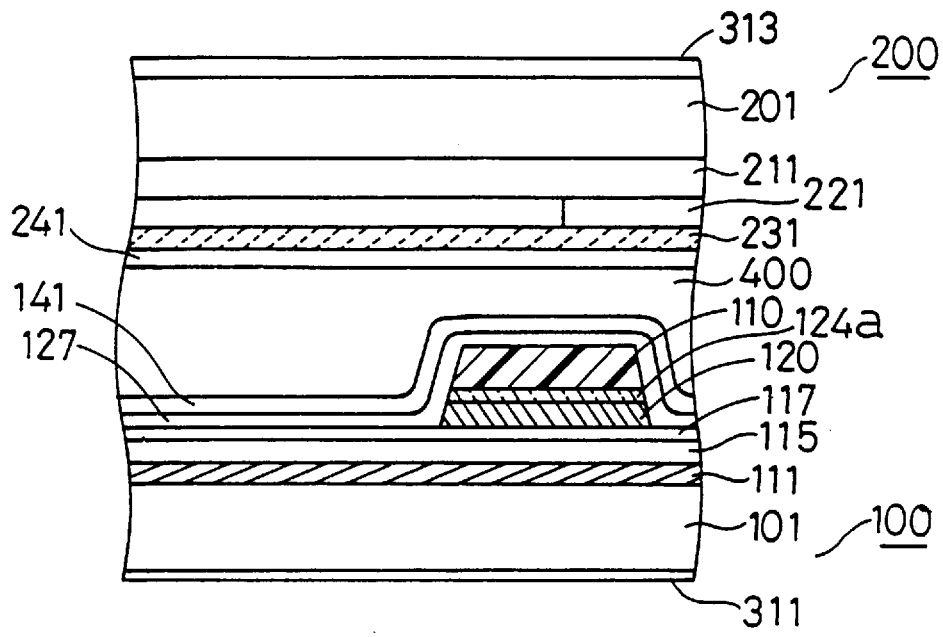
FIG. 5 is a schematic cross-section of the liquid crystal display device taken along line D–D' in FIG. 1.

A further advantage of the embodiment is that, as shown in FIG. 5, the signal line (110) is exactly identical in outline to a low-resistance semiconductor film (124a) and semiconductor film (120). More specifically, not only the first and second gate insulator films (115), (117) but also the low-resistance semiconductor film (124a) and semiconductor film (120) are laminated at the individual one of crosspoints of signal lines (110) and scanning lines (111). Due to this, even on occasions where mask deviations take place during patterning process steps, the capacitance can remains unchanged between the signal lines (110) and scanning lines (111), thereby suppressing variations or fluctuations in scanning-line capacitance or in signal-line capacitance among devices manufactured. Moreover, this may suppress or eliminate interlayer shorting otherwise occurring due to static electricity at crosspoints of signal lines (110) and scanning lines (111), contaminants during process steps, or presence of pinholes in respective dielectric films (115), (117), thus enabling provision of higher yield of production.

A still further advantage is that since the signal line (110) coincides in outline with low-resistance semiconductor film (124a) as shown in FIG. 6, unlike the prior art causing patterning to be done at separate process steps, it is possible to sufficiently suppress occurrence of capacitive variations between the signal lines (110) and scanning lines (111) even if mask alignment deviations take place during respective patterning steps.

A yet further advantage is that when the signal line (110) is designed to overlap the elongate region (113) of scanning line (111), that is, even when in the structure of FIG. 6 the elongate region (113) being disposed neighboring through the signal line (111) is connected under the signal line (111), since the semiconductor film (120) in addition to respective dielectric films (115), (117) is disposed between the signal line (110) and the elongate region (113) of scanning line (111), any interlayer shorting can be prevented from occurring due to static electricity, contaminants during processes or pinholes within respective dielectric films (115), (117), attaining high manufacturing yield. And, with such an arrangement causing the elongate region (113) to be disposed under the pixel electrode (131) neighboring to signal line (111), the capacitive coupling between signal line (111) and pixel electrode (131) can be shielded by elongate region (113) lightening adverse interference of the potential at pixel electrode (131) with potential changes of signal line (111). Yet, the semiconductor film (120) as disposed between signal line (111) and dielectric films (115), (117) and low-resistance semiconductor film (124a) are identical in outline with signal line (111). For these reasons, it is permissible that signal line (111) and pixel electrode (131) are located closely to each other attaining further increased aperture ratio.

(Structure near Outer Periphery of Scanning line)

A reference is made to FIGS. 1 and 3 for explanation of the structure near the outer peripheral section of scanning line (111).

The scanning line (111) made of Al—Y alloy is taken out on the side of one edge (101a) of the glass substrate (101), constituting a lower-layer wiring line section (111a) that is guided toward a slant wiring line section (150) and a scanning-line connection pad (152).

In the slant wiring line section (150) two laminated dielectric films (115), (117) are disposed on the lower-layer wiring line section (111a) as extended from the scanning line (111). Also provided on these two dielectric films (115), (117) are a semiconductor coated film (119), a low-resistance semiconductor coated film (123) and an upper-layer wiring line section (125a) consisting of a Mo—W alloy film being same as signal line (110) in material and in process, which are laminated sequentially. An interlayer dielectric film (127) is formed on the upper-layer wiring line section (125a).

And, in the base section of this slant wiring line section (150), a first contact hole (153) and a second contact hole (154) making a pair are disposed closely to each other in the wiring-line direction, whereby the lower-layer wiring line section (111a) which is extended from the scanning line (111) and the upper-layer wiring line section (125a) are electrically connected to each other by the signal line connection layer (131), which is the same in material (ITO, here) and process as pixel electrode (131), through the first contact hole (155) and second contact hole (156). Note that the second contact hole (154) is an opening penetrating the two-layered dielectric films (115), (117), semiconductor coated film (119), low-resistance semiconductor coated film (123) and upper-layer wiring line section (125a) causing the principal surface of the lower-layer wiring line section (111a) to be partly exposed, whereas the first contact hole (153) is an opening penetrating the interlayer dielectric film (127) exposing part of the principal surface of upper-layer wiring line section (125a).

In the scanning line pad (152) also, a pair of first contact hole (155) and second contact hole (156) are disposed closely to each other in the wiring-line direction, whereby the lower-layer wiring line section (111a) of scanning line (111) and the upper-layer wiring line section (125a) are electrically connected by the signal line connection layer (131)—this is the same in material (ITO, here) and process as pixel electrode (131)—to each other through the first contact hole (155) and second contact hole (156). Note that the second contact hole (156) is an opening penetrating the double-layered dielectric films (115), (117), semiconductor coated film (119), low-resistance semiconductor coated film (123) and upper-layer wiring line section (125a) causing the principal surface of the lower-layer wiring line section (111a) to be partly exposed in the same manner as in the second contact hole (154) as mentioned above; the first contact hole (155) is similar to the aforesaid first contact hole (153) in that it is an opening penetrating the interlayer dielectric film (127) exposing part of the principal surface of upper-layer wiring line section (125a).

With such an arrangement, the resulting slant wiring line section (150) of scanning line (111) is constituted from the upper-layer wiring line section (125a) as comprised of a Mo—W alloy film that is fabricated using the same material and same process as the signal line (110) subjected to patterning separately, and the lower-layer wiring line section (111a) as extended from the scanning line (111) made of Al—Y alloy film; by these two layers, the base section of slant wiring line section (150) and scanning line pad (152) are electrically connected together.

Due to such structure, in the slant wiring line section (150), even if it is happen that any one of upper-layer wiring line section (125a) and lower-layer wiring line section (111a) is broken or open-circuited accidentally, the other of them still remains connected successfully suppressing or eliminating failure of electrical interconnection at slant wiring line section (150).

Further, sufficient reduction in resistance can be accomplished because of the fact that the slant wiring line section (150) includes the lower-layer wiring line section (111a) formed of Al—Y alloy that is one low-resistance material employing Al as its major component.

It should be noted that in this embodiment, the region of second contact hole (156), that is, the laminated region of lower-layer wiring line section (111a) and signal line connection layer (131) mainly functions as an interconnection region of the scanning line pad (152).

(Structure near Outer Periphery of Signal Line)

A reference is made to FIGS. 1 and 4 for explanation of the structure near the outer peripheral section of signal lines (110).

A lower-layer wiring line section (111b), which is the same in material—Al—Y alloy—and in process as scanning lines (111), is disposed at the slant wiring line section (160) of signal line (110) and the signal line pad (162) on the side of one edge (101b) of glass substrate (101) in a one-to-one correspondence manner with each signal line (110).

In the slant wiring line section (160) two layers of dielectric films (115), (117) are disposed on the lower-layer wiring line section (116b). Provided on such two-layered dielectric films (115), (117) are semiconductor coated film (119), low-resistance semiconductor coated film (123) and lower-layer wiring line section (111b)—i.e. signal line (110) —made of Mo—W alloy as extended from signal line (110) while causing the interlayer dielectric film (127) to be disposed on the upper-layer wiring line section (125b).

And, in the base section of this slant wiring line section (160), a first contact hole (163) and a second contact hole (164) forming a pair are disposed closely to each other in the wiring-line direction, whereby the upper-layer wiring line section (125b) which is extended from the scanning line (111) and the upper-layer wiring line section (111b) are electrically connected to each other by signal line connection layer (131) same in material—ITO, here—and process as pixel electrode (131). Note that the second contact hole (164) is an opening penetrating the double-layered dielectric films (115), (117), semiconductor coated film (119), low-resistance semiconductor coated film (123) and upper-layer wiring line section (125b) causing the principal surface of the lower-layer wiring line section (111b) to be partly exposed, whereas the first contact hole (163) is an opening penetrating the interlayer dielectric film (127) exposing part of the principal surface of upper-layer wiring line section (125b).

In the signal line pad (162) also, a pair of first contact hole (165) and second contact hole (166) are disposed closely to each other along the wiring-line direction, whereby the upper-layer wiring line section (125b) extended from signal line (110) and the lower-layer wiring line section (111b) are electrically connected to each other by the signal line connection layer (131), which is the same in material (ITO, here) and process as pixel electrode (131). Note that the second contact hole (166) is an opening penetrating the double-layered dielectric films (115), (117), semiconductor coated film (119), low-resistance semiconductor coated film (123) and upper-layer wiring line section (125b) causing the principal surface of the lower-layer wiring line section (111b) to be partly exposed in the same manner as in the second contact hole (164) as discussed previously; the first contact hole (165) is similar to the aforesaid first contact hole (163) in that it is an opening penetrating the interlayer dielectric film (127) exposing part of the principal surface of upper-layer wiring line section (125b).

With such a structure, in the slant wiring line section (160), the upper-layer wiring line section (125b) as extended from the signal line (110) made of Mo—W alloy film and the lower-layer wiring line section (111b) comprised of the same material—Al—Y alloy—as scanning lines (111) and fabricated in the same process as scanning lines (111) are disposed in lamination; by these two layers, the base section of slant wiring line section (160) and the signal line pad (162) are electrically coupled together.

Due to this, in the slant wiring line section (160), even on occasions where any one of upper-layer wiring line section (125b) made of Mo—W alloy and the lower-layer wiring line section (111b) is broken to be open-circuited, the other thereof still remains connected suppressing or eliminating failure of electrical interconnection at slant wiring line section (160).

Furthermore, sufficient reduction in resistance can also be accomplished since the slant wiring line section (160) includes the lower-layer wiring line section (111b) formed of Al—Y alloy that is one typical low-resistance material employing Al as its major component.

It should be noted that in this embodiment, the region of second contact hole (166), that is, the laminated region of lower-layer wiring line section (111b) and signal line connection layer (131) acts as the major interconnection region of the signal line pad (162).

With the arrangement as described above, where external connection nodes—including a bump of driver IC, terminals of flexible printed circuit (FPC) board, tape carrier package (TCP) or the like—are to be electrically connected to the signal line pads (162) and scanning line pads (152) by way of an interconnection layer(s) such as anisotropic conductive films (ACFs), even when the signal line pads (162) and scanning line pads (152) are equal in connection conditions, it becomes possible to substantially equalize heat and pressure or the like as applied to such interconnection layers due to the fact that the signal line pads (162) and scanning line pads (152) are substantially the same in arrangement, enabling manufacture under the same condition. Specifically, with this embodiment, the connection region of each scanning line pad (152) is mainly constituted from the lamination structure of the lower-layer wiring line section (111a) made of Al—Y alloy film as taken out of a corresponding scanning line (111) and the signal line connection layer (131) made of ITO that is the same as the material constituting pixel electrodes (131); on the other hand, the connection region of each signal line connection pad (162) is mainly constituted from the lower-layer wiring line section (111b) made of Al—Y alloy as formed simultaneously with fabrication of scanning lines (111), and the signal line connection layer (131) made of ITO that is the same as the material constituting pixel electrodes (131), wherein the structure is substantially the same.

(Manufacturing Process of Array Substrate)

A method of forming or manufacturing the array substrate (100) will be described in detail with reference to FIGS. 7 through 13.

(1) First Process Step

Figure 7:
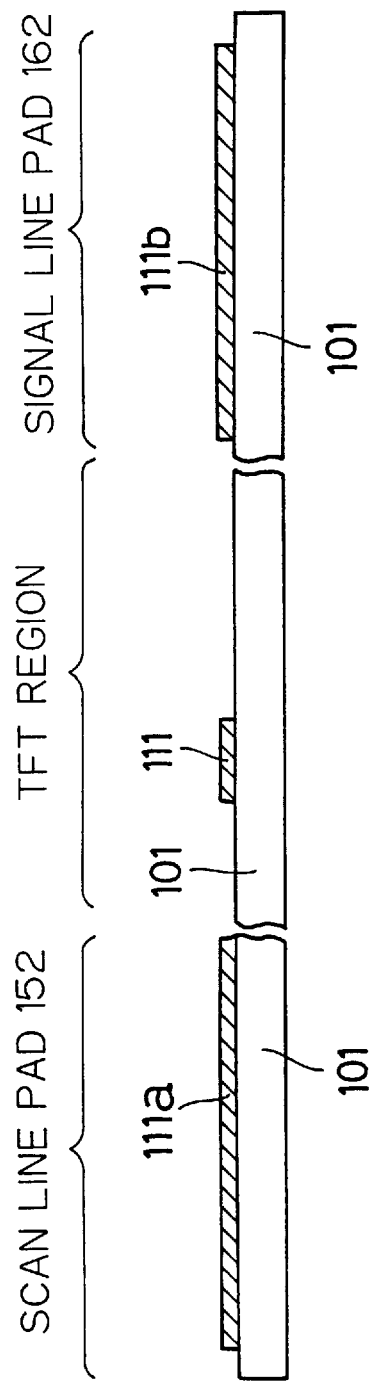
FIG. 7 is a diagram for explanation of a first step in the manufacture of the array substrate shown in FIG. 1.

As shown in FIG. 7, an Al—Y alloy film and an Mo film are sequentially deposited by known sputtering techniques on the glass substrate (101) to a predetermined thickness of 200 nanometers (nm) and to 30 nm, respectively. The resulting structure is then subject to exposure process using a first mask pattern while development and patterning (first patterning) are carried out.

This results in formation of 480 scanning lines (111) on the glass substrate (101) while permitting simultaneous fabrication of lower-layer wiring line sections (111a), each of which constitutes the slant wiring line section (150) of scanning line (111) and scanning line pad (152) on its one edge (101a) side, and lower-layer wiring line sections (111b) each constituting slant wiring line section (160) of signal line (110) and signal line pad (162) on the side of another edge (101b) of the glass substrate.

Further, in the TFT region, a gate electrode is formed which is integral with a corresponding scanning line (111)

and is taken out to extend in a specific direction at right angles to scanning lines (111). At the patterning process step elongate regions (113) are also fabricated simultaneously each of which is taken out to extend in the perpendicular direction to scanning lines (111) for formation of the storage capacitor (Cs) required (see FIG. 1).

(2) Second Process Step

Figure 8:
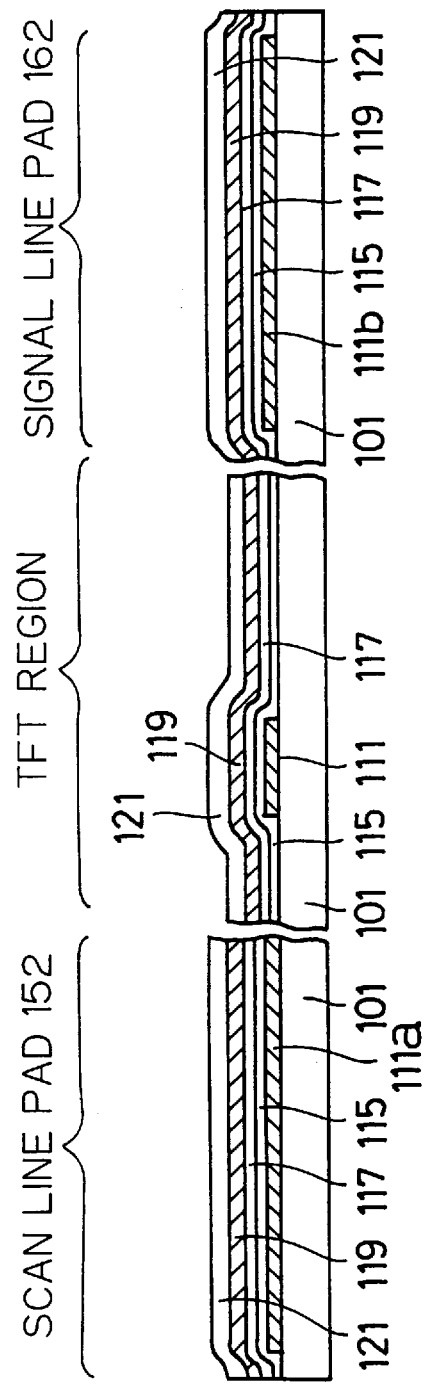
FIG. 8 is a diagram for explanation of a second step in the manufacture of the array substrate shown in FIG. 1.

After completion of the first step, as shown in FIG. 8, a first gate insulator film (115) made of silicon oxide is deposited using plasma chemical vapor deposition (CVD) techniques to a thickness of 150 nm; thereafter, a second gate insulator film (117) made of silicon nitride 150 nm thick, a 50-nm thick semiconductor coated film (119) made of a-Si:H, and 200-nm thick silicon-nitride channel protective coated film (121) are formed sequentially in this order without exposing them to atmosphere.

(3) Third Process Step

Figure 9:
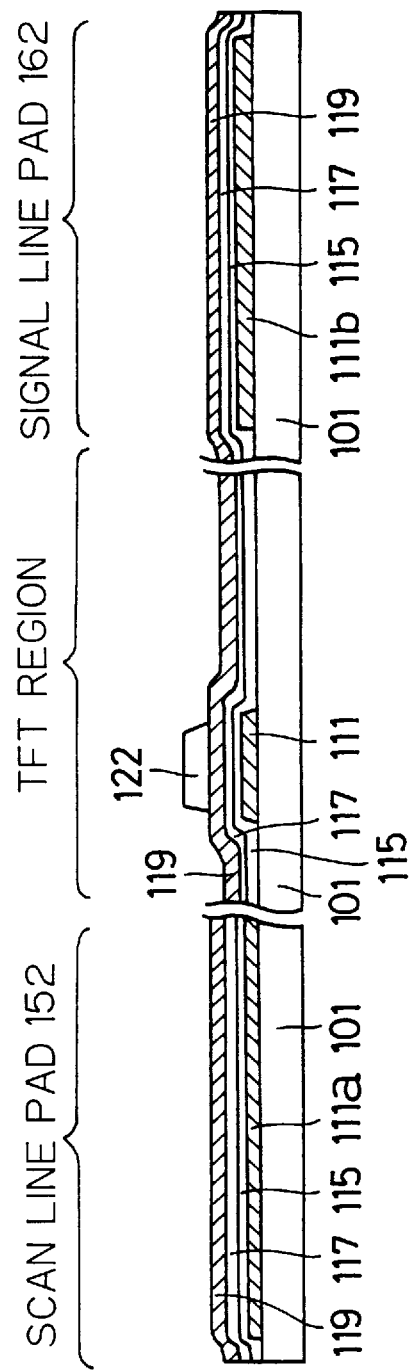
FIG. 9 is a diagram for explanation of a third step in the manufacture of the array substrate shown in FIG. 1.

After the second step, as shown in FIG. 9, the channel protective coated film (121) is subject using rear-surface exposure techniques to patterning process with the scanning lines (111) being as a mask while the coated film (121) is self-aligned with scanning lines (111), and is then subject to exposure process using a second mask pattern to ensure that it corresponds to each TFT region. Thereafter, development and patterning (second patterning) are performed to fabricate an island-like channel protective film (122).

(4) Fourth Process Step

Figure 10:
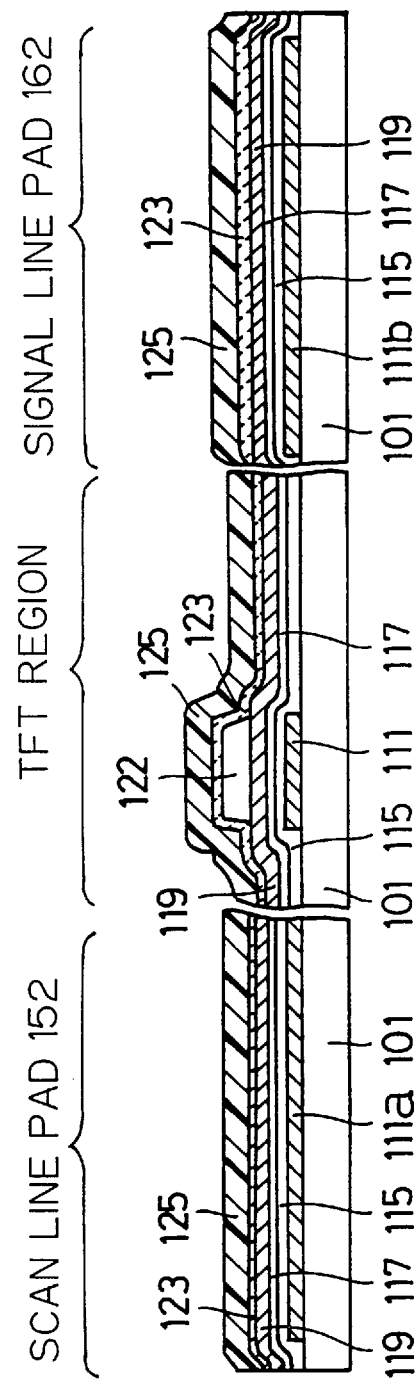
FIG. 10 is a diagram for explanation of a fourth step in the manufacture of the array substrate shown in FIG. 1.

After completion of the third step, as shown in FIG. 10, surface treatment using hydrogen fluoride (HF) solution is applied to the surface of a semiconductor coated film (119) as exposed to obtain good ohmic contacts. Then, a low-resistance semiconductor coated film (123) which is made of n+ type-doped amorphous silicon (n+a-Si:H) containing therein phosphorus (P) impurity is deposited by plasma CVD techniques to a thickness of 30 nm. Next, an Mo—W alloy film (125) is deposited thereon using sputtering techniques to a thickness of 300 nm.

(5) Fifth Process Step

Figure 11:
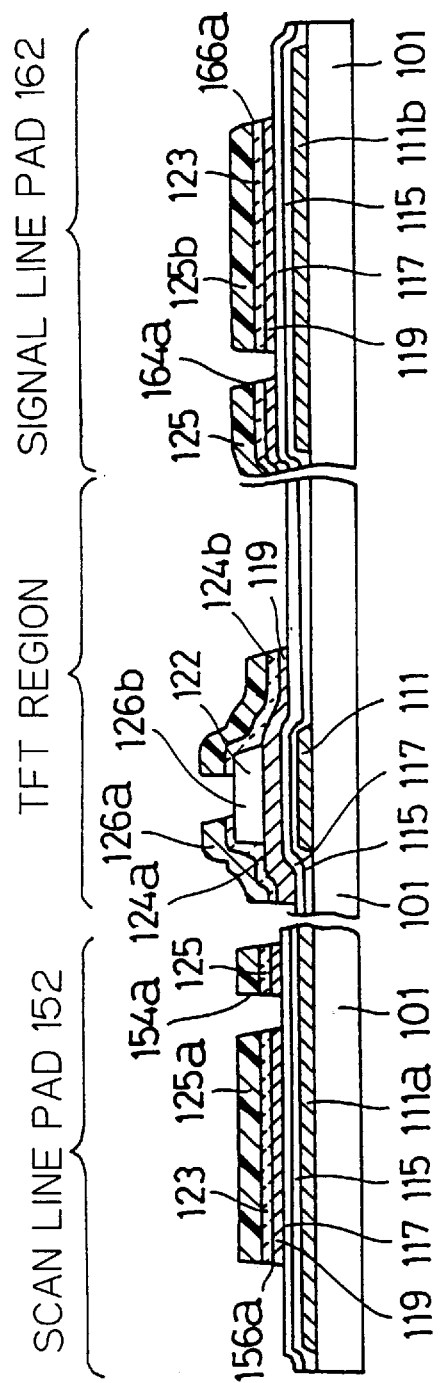
FIG. 11 is a diagram for explanation of a fifth step in the manufacture of the array substrate shown in FIG. 1.

After completion of the fourth step, as shown in FIG. 11, the resulting structure is subject to exposure and development process using a third mask pattern so that all of the Mo—W alloy film (125), low-resistance semiconductor coated film (123) and semiconductor coated film (119) are patterned by plasma etching techniques at a time by controlling the selective etching rate of the first gate insulator film (115) or second gate insulator film (117) and the channel protective film (122). This is the third patterning process.

With such a process, in the TFT region, the low-resistance semiconductor film (124a) and source electrode (126b) are formed integrally, whereas low-resistance semiconductor film (124b) and its associated signal line (110) are formed integrally.

In the base section of the scanning line pad (152) and its associative slant wiring line section (150), the Mo—W alloy film (125) is patterned along the lower-layer wiring line section (111a) forming the upper-layer wiring line section (125a), while the low-resistance semiconductor coated film (123) and semiconductor coated film (119) are patterned simultaneously along the upper-layer wiring line section (125a). At the same time, openings (154a), (156a) are formed which correspond to the aforementioned second contact holes (154), (156) and penetrate the upper-layer wiring line section (125a), low-resistance semiconductor coated film (123) and semiconductor coated film (119).

Similarly, at the base section of the signal line pad (162) and slant wiring line section (160) also, the Mo—W alloy film (125) is patterned along the lower-layer wiring line section (111b) forming the upper-layer wiring line section (125a) as extended from signal line (110), while the low-resistance semiconductor coated film (123) and semiconductor coated film (119) are patterned simultaneously along the upper-layer wiring line section (125b). At the same time, openings (164a), (166a) are formed which correspond to the aforementioned second contact holes (164), (166) and penetrate the upper-layer wiring line section (125b), low-resistance semiconductor coated film (123) and semiconductor coated film (119).

While dry etching techniques are used here to pattern the Mo—W alloy film (125), low-resistance semiconductor coated film (123) and semiconductor coated film (119), wet etching techniques may alternatively be employed therefor.

(6) Sixth Process Step

After completion of the fifth step, the interlayer dielectric film (127) of silicon nitride is then deposited on resultant structure to a thickness of 200 nm.

Figure 12:
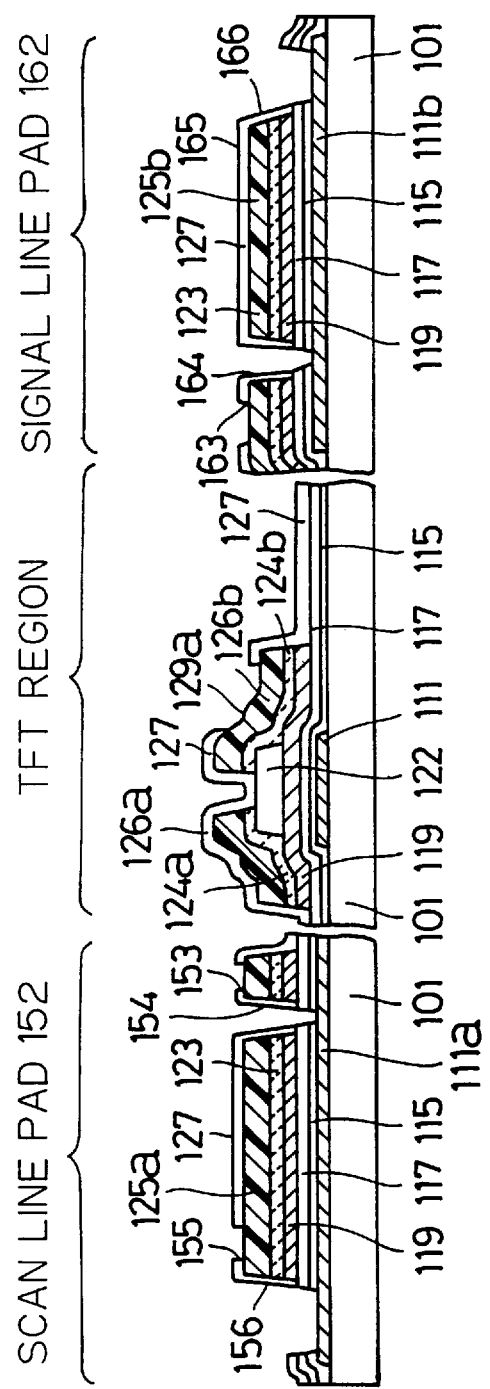
FIG. 12 is a diagram for explanation of a sixth step in the manufacture of the array substrate shown in FIG. 1.

Then, as shown in FIG. 12, exposure and development processes are effected using a fourth mask pattern; next, part of interlayer dielectric film (127) in a region corresponding to the source electrode (126b) is removed away to form a contact hole (129a) using dry etching techniques.

At the base section of scanning line pad (152) and slant wiring line section (150), both the interlayer dielectric film (127) and the first and second gate insulator films (115), (117) corresponding to the openings (154a), (156a) are removed away at a time to form second contact holes (154), (156) (the fourth patterning); simultaneously, the interlayer dielectric film (127) near the second contact holes (154), (156) is removed to form first contact holes (153), (155) each of which makes a pair with a corresponding one of the second contact holes (154), (156).

Simultaneously, at the base section of signal line pad (162) and slant wiring line section (160), both the interlayer dielectric film (127) and the first and second gate insulator films (117) corresponding to the openings (164a), (166a) are removed away at a time forming second contact holes (164), (166) (the fourth patterning); at the same time, the interlayer dielectric film (127) near the second contact holes (164), (166) is removed away forming first contact holes (163), (165) which constitute pairs with the second contact holes (164), (166), respectively.

(7) Seventh Process Step

Figure 13:
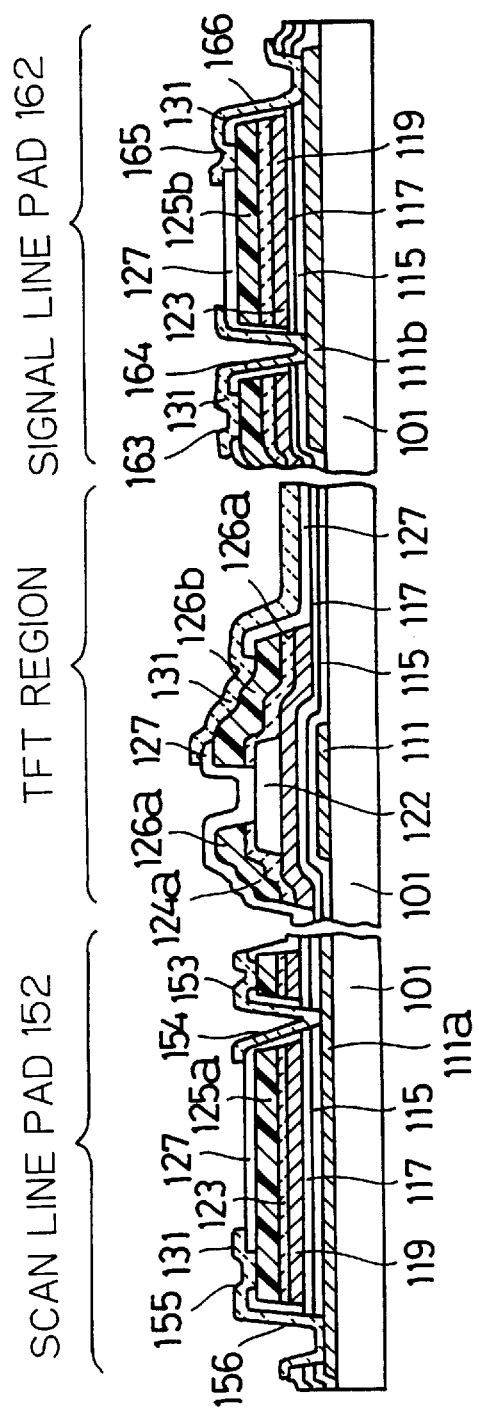
FIG. 13 is a diagram for explanation of a seventh step in the manufacture of the array substrate shown in FIG. 1.

After completion of the sixth step, as shown in FIG. 13, an ITO film is deposited by sputtering techniques to a thickness of 100 nm. The resulting structure is then subject to patterning treatment by exposure, development and dry etching techniques using a fifth mask pattern (the fifth patterning), thereby forming pixel electrodes (131). The patterning of such ITO film may alternatively be performed using known wet etching techniques rather than the dry etching.

At the base section of the scanning line pad (152) and slant wiring line section (150), a signal line connection layer (131) is formed electrically connecting the first contact holes (153), (155) to second contact holes (154), (156). This results in that the scanning line (111) and scanning line pad (152) are electrically coupled together by the double-layered slant wiring line section (150) consisting of the lower-layer wiring line section (111a) and upper-layer wiring line section (125a).

In the base section of the signal line pad (160) and signal lines (160) also, a signal line connection layer (131) is formed electrically connecting the first contact holes (163), (165) to second contact holes (164), (166). This results in that the signal line (110) and signal line pad (162) are electrically coupled to each other by the double-layered slant wiring line section (160) consisting of the lower-layer wiring line section (111b) and upper-layer wiring line section (125b).

(Advantage of First Embodiment)

With the array substrate in accordance with the foregoing illustrative embodiment, the array substrate can be formed or manufactured by use of basically five masks. More specifically, the productivity can be improved with a decreased number of masks used while avoiding a decrease in the manufacturing yield thereof, as a result of locating the pixel electrodes at the uppermost position, and of employing a specific manufacturing method allowing several process steps to be done simultaneously which steps include: patterning the semiconductor coated films as well as the signal lines, source and drain electrodes at a time with the same mask pattern used therefor; forming the contact holes for interconnection of each source electrode and its associated pixel electrode; and forming the contact holes for exposure of contact nodes of signal lines and scanning line s.

Further, each slant wiring line section of signal lines and scanning lines has a double-layered structure consisting of the upper-layer wiring line section made of Mo—W alloy film constituting an individual signal line and the lower-layer wiring line section of Al—Y alloy film constituting a corresponding scanning line permitting electrical connection between the base section of each slant wiring line section and a corresponding pad associated therewith. With such a structure, even if either one of such lower-layer wiring line section and upper-layer wiring line section is cut off or broken to be open-circuited accidentally, the other of them still continues to be connected eliminating occurrence of unwanted disconnection or failure of electrical interconnection as a whole.

Furthermore, a sufficient reduction in resistance can be achieved due to the fact that the slant wiring line section includes a specific wiring line layer that is comprised of a low-resistance material using at least Al as its major component.

Still further, since the signal line pads and scanning line pads for use in connecting bumps of external driver ICs and/or terminals of TCPs are substantially the same in structure, it becomes possible to allow the both to be connected under the same condition.

(Other Possible Modifications)

In the illustrative embodiment discussion is directed to the case where the semiconductor film is made of a-Si:H; alternatively, it may also be polycrystalline silicon or the like. Driver circuitry may be provided at the peripheral region as formed integrally with the array substrate.

Also, where the pixel electrodes are disposed over the signal lines and/or scanning lines with part of the former overlapping the latter, an appropriate shield electrode comprised of a metallic film may be additionally provided at least between the pixel electrode and an associative signal line while dielectric films are used for electrical insulation therebetween. If this is the case, it becomes possible to reduce adverse influence of potential variations on signal lines upon pixel electrodes.

(Modifications of Structure near Outer Periphery of Signal Lines and Scanning line s)

Figure 14:
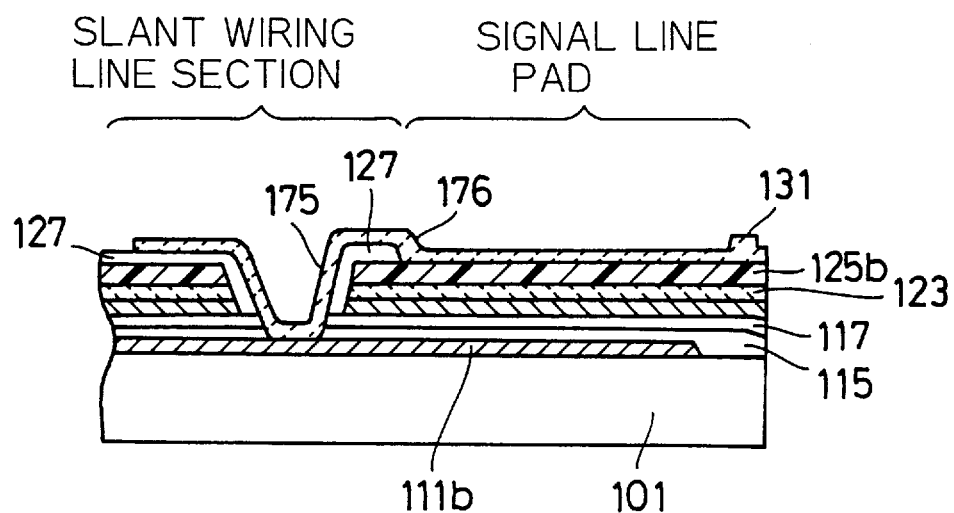
FIG. 14 is a diagram showing one modification of the structure near the outer periphery of signal lines.

A reference is made to FIG. 14 for description of one possible modification of the structure in the vicinity of the outer peripheral section of signal line (110).

The lower-layer wiring line section (111b) which is the same in material—Al—Y alloy film, here—and in process with scanning lines (111) is disposed, for each signal line (110), at the slant wiring line section (160) of a signal line (110) and signal line pad (162) on the side of one edge (101b) of the glass substrate (101).

In the slant wiring line section (160) two-layered dielectric films (115), (117) are disposed on the lower-layer wiring line section (111b). Formed and laminated on such two-layered dielectric films (115), (117) are the semiconductor coated film (119), low-resistance semiconductor coated film (123), and upper-layer wiring line section (125b)—signal line (110)—made of Mo—W alloy film as extended from signal line (110) with interlayer dielectric film (127) being arranged on upper-layer wiring line section (125b).

The base section of this slant wiring line section (160) is similar in structure to the embodiment as mentioned previously: at the signal line pad (162), a pair of first contact hole (175) and second contact hole (176) are disposed respectively allowing the upper-layer wiring line section (125b) extended from a corresponding signal line (110) to be electrically connected with the lower-layer wiring line section (111b) by signal line connection layer (131) which is the same in material—ITO, here—and in process as pixel electrodes (131). Additionally, the first contact hole (175) is an opening that penetrates the double-layered dielectric films (115), (117), semiconductor coated film (119), low-resistance semiconductor coated film (123) and upper-layer wiring line section (125b) for exposure of part of the principal surface of lower-layer wiring line section (111b), whereas the second contact hole (176) is an opening penetrating the interlayer dielectric film (127) for permission of partial exposure of the principal surface of upper-layer wiring line section (125b).

It can be said that this modification thus arranged is similar to the aforesaid embodiment except that the signal line pad (162) is constituted from a specific lamination or multilayered structure consisting of the lower-layer wiring line section (111b), double-layered dielectric films (115), (117), semiconductor coated film (119) disposed on such dielectric films (115), (117), low-resistance semiconductor coated film (123), upper-layer wiring line section (125b)— signal line (110)—of Mo—W alloy film as extended from signal line (110), and signal line connection layer (131) of ITO constituting pixel electrode (131).

Preferably, the structure near the outer periphery of scanning lines (111) may be arranged in the same manner as that of signal line side.

Second Embodiment

An optical transmissive LCD device (1) in accordance with a second embodiment of the present invention will be described with reference to FIGS. 15 through 26.

Figure 16:
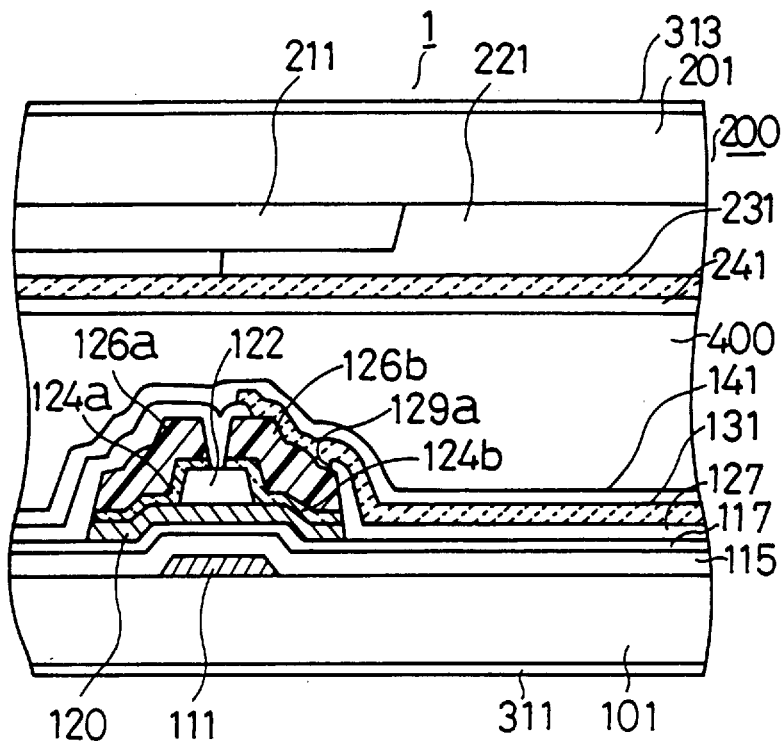
FIG. 16 is a schematic cross-section of the liquid crystal display device taken along line A–A' in FIG. 15.

As shown in FIG. 16, LCD device (1) has an array substrate (100), an opposed substrate (200), and a TN liquid crystal held therebetween with an orientation film (141) being laid between it and array substrate (100) and with another orientation film (241) between liquid crystal and opposed substrate (200). These orientation films (141), (241) are made of polyimide resin. Also, polarization plates (311), (313) are adhered to the outer surfaces of array substrate (100) and opposed substrate (200), respectively.

Figure 15:
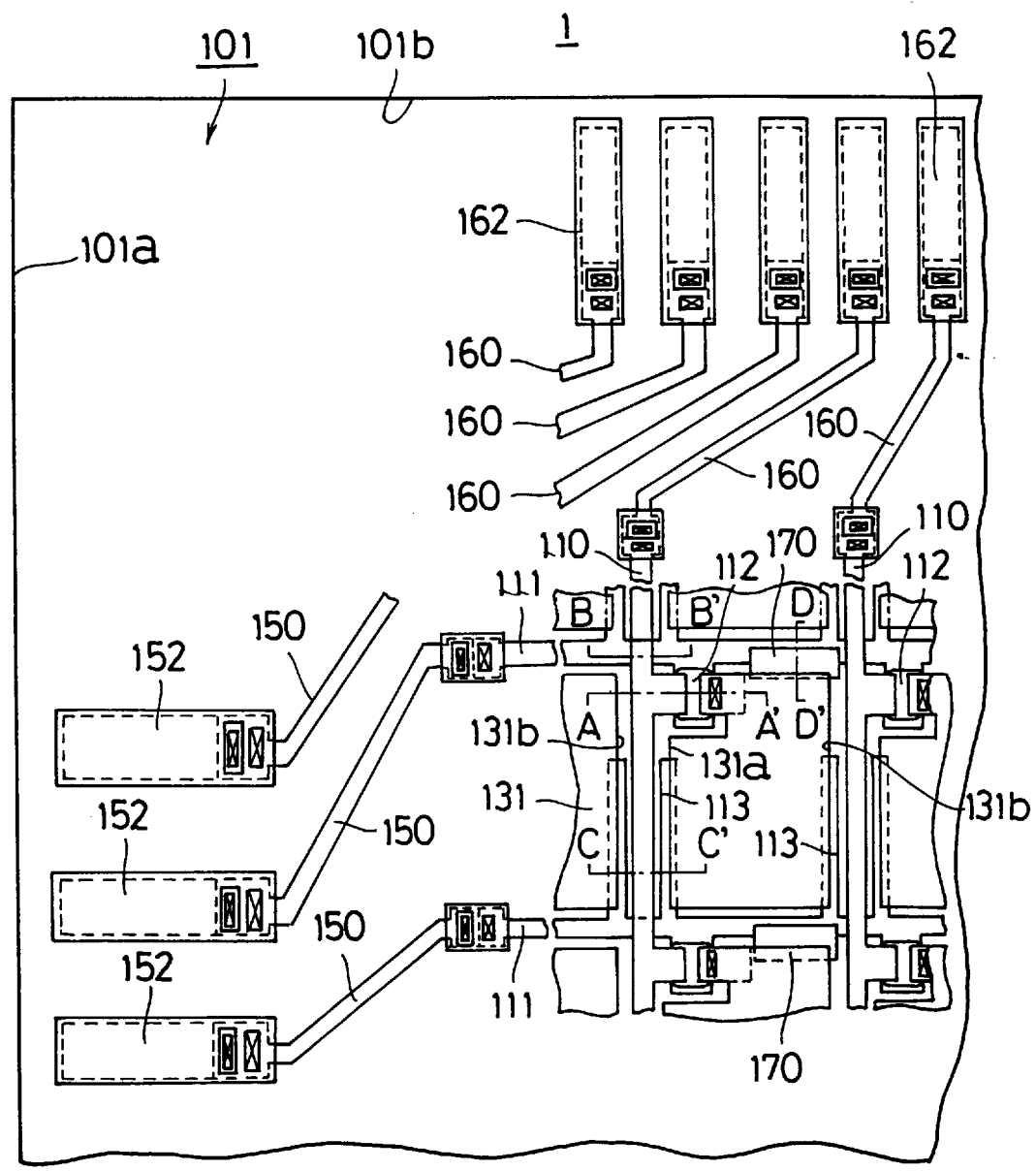
FIG. 15 is a schematical plan view of part of an array substrate in accordance with a second embodiment of the invention.

FIG. 15 depicts a schematical plan view of the array substrate (100), wherein the lower side of this drawing is to be located at the upper side of the display screen of LCD device (1) while allowing scanning lines to be successively selected in the sequence from the lower to the upper side of the illustration.

The array substrate (100) includes 480 scanning lines (111) made of aluminum-yttrium (Al—Y) alloy as disposed on a glass substrate (101). One end of each scanning line (111) is taken out to extend toward one edge (101a) side of the glass substrate (101), and is electrically connected through a slant wiring line section (150) to a corresponding one of scanning line connection pads (152). Note here that the slant wiring line sections (150) and scanning line pads (152) may be substantially the same as those of the first embodiment both in structure and in manufacturing process step.

The array substrate (100) also includes 1,920 signal lines (110) made of Mo—W alloy, which lines extend to intersect the scanning lines (111) at substantially right angles on the glass substrate (101). Each signal line (110) is taken out to run toward the other edge (101b) side of the glass substrate (101), thereby forming a corresponding signal line pad (162) via a slant wiring line section (160). Note that each slant wiring line section (160) and signal line pad (162) may be substantially the same as those of the first embodiment both in structure and in manufacturing process.

A TFT (112) is disposed near each of the crosspoints of the scanning lines (111) and signal lines (110). Also, a pixel electrode (131) of TFT (112) is disposed over the scanning line (111) and signal line (110) with an interlayer dielectric film (127) being provided therebetween. This interlayer dielectric film (127) may be an inorganic dielectric film made of silicon nitride or the like; more preferably, the interlayer dielectric film is constituted from a multi-layered film of a combination of such inorganic dielectric film and organic resin coated film thereby further improving the surface flatness and interlayer dielectricity.

(Structure of TFT Region)

An explanation will be given of the structure of TFT (112).

Each scanning line (111) includes a thin strip-like elongate region (113) extending along the signal line (110) to overlap the edges (131a), (131b) of one neighboring pixel electrode (131). As shown in FIG. 4, this elongate region (113) and pixel electrode (131) overlap each other at certain overlap region (OS), with a first gate insulator film (115), a second gate insulator film (117) and interlayer dielectric film (127) being laid therebetween, causing such overlap region (OS) to constitute the storage capacitor (Cs).

A planar rectangular light-shield layer (170) is provided at a certain place across a gap between the position of the upper edge side (along the scanning line (111)) of pixel electrode (131) excluding the TFT (121) region and the adjacent ones of the scanning lines (111). This light shield layer (170) is formed using the same material as that of signal lines (110).

The opposed substrate (200) opposing this array substrate (100) is disposed on a glass substrate (201), and includes a matrix-shaped light shielding film (211) made of a chosen resin material which acts to block any incoming light rays by way of the TFT (121) region and gap spacings between the pixel electrode (131), signal lines (110) and scanning lines (111). A color filter (221) having three color components of red (R), green (G) and blue (B) is disposed in a certain region corresponding to the pixel electrode (131). Provided on this is another opposed electrode (231) made of a transparent conductive material.

With the array substrate (100) of this LCD device (1) thus arranged, since the interlayer dielectric film (127) alone or both the first and second gate insulator films (115), (117) and interlayer dielectric film (127) are disposed between the pixel electrode (131) and signal lines (110) and between the pixel electrode (131) and scanning lines (111), it is possible for pixel electrode (131) to be disposed sufficiently close to or over respective wiring lines (110), (111), enabling achievement of increased aperture ratio.

In addition, since the storage capacitor (Sc) is specifically formed between the pixel electrode (131) and the elongate region (113) as extended from a corresponding scanning line (111) neighboring to this pixel electrode (131), it is no longer necessary to employ any additional storage capacitor wiring lines enabling attainment of further increased aperture ratio. And, three kinds of dielectric films (115), (117), (127) are disposed between the pixel electrode (131) and elongate region (113) so that it becomes possible to successfully suppress occurrence of electrical interlayer shorting due to the inherent structure of this embodiment.

Incidentally, in this embodiment, the pixel area is defined in planar size not by the light-shield film (211) as disposed on the opposed electrode (200), but by the elongate region (113) on the array substrate (100). Further, the light shield layer (170) is provided between the upper edge side of pixel electrode (131) and one scanning line (111) corresponding to this pixel electrode (131) so that this light shield layer (170) can also contribute to shape definition of the upper edge side of pixel electrode. Accordingly, the alignment accuracy of the product may be determined exclusively depending upon an alignment accuracy of a first mask pattern for use in patterning scanning lines (111) to a fifth mask pattern for patterning pixel electrodes (131), rather than an alignment accuracy of the array substrate (100) to opposed substrate (200). This may avoid the need to add extra margins to the width of light shield film (211) in view of possible alignment variations of the array substrate (100) and opposed substrate (200), thus enabling accomplishment of further increased aperture ratio.

Yet another advantage of the embodiment is that even when the elongate region (113) of scanning line (111) is fully extended along the edges (131a), (131b) (along the signal line (110)) of pixel electrode (131) in order to define the boundary of pixel area, it is possible to suppress or eliminate an excessive increase in storage capacitor (Cs) without degrading the productivity. This can be said because the interlayer dielectric film (127) is disposed—in addition to the first gate insulator film (115) and second gate insulator film (117)—between the pixel electrode (131) and the elongate region (113) of scanning line (111).

Figure 17:
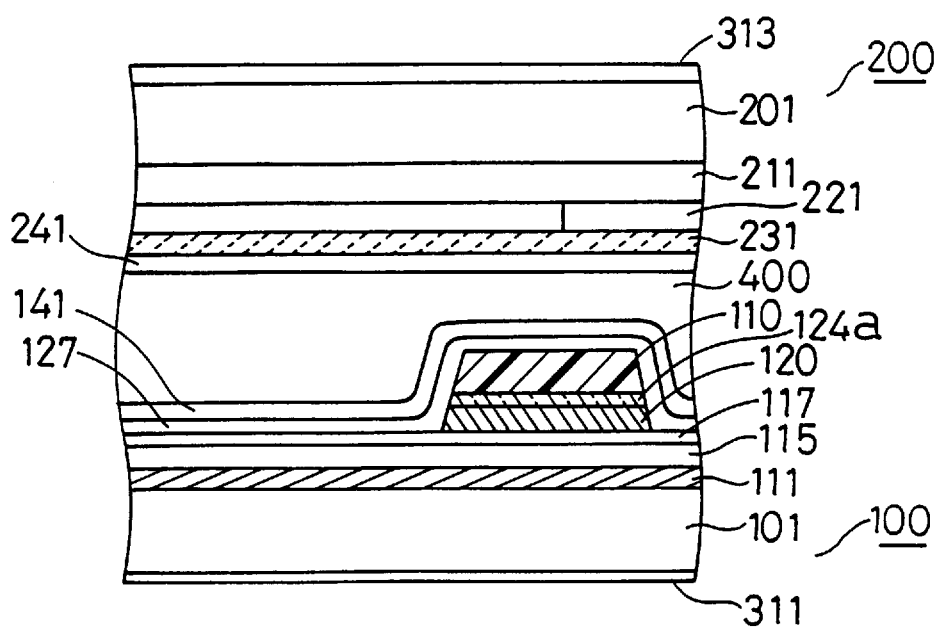
FIG. 17 is a schematic cross-section of the liquid crystal display device taken along line B–B' in FIG. 15.

A further advantage is that, as shown in FIG. 17, the signal line (110) is exactly identical in outline to a low-resistance semiconductor film (124a) and semiconductor film (120). More specifically, not only the first and second gate insulator films (115), (117) but also the low-resistance semiconductor film (124a) and semiconductor film (120) are laminated at the individual one of crosspoints of signal lines (110) and scanning lines (111). Due to this, even on occasions where mask deviations take place during patterning process steps, the capacitance can remains unchanged between the signal lines (110) and scanning lines (111), thereby suppressing variations or fluctuations in scanning-line capacitance or in signal-line capacitance among devices manufactured. Moreover, this may suppress or eliminate interlayer shorting otherwise occurring due to static electricity at crosspoints of signal lines (110) and scanning lines (111), contaminants during process steps, or presence of pinholes in respective dielectric films (115), (117), thus enabling provision of higher yield of production.

Figure 18:
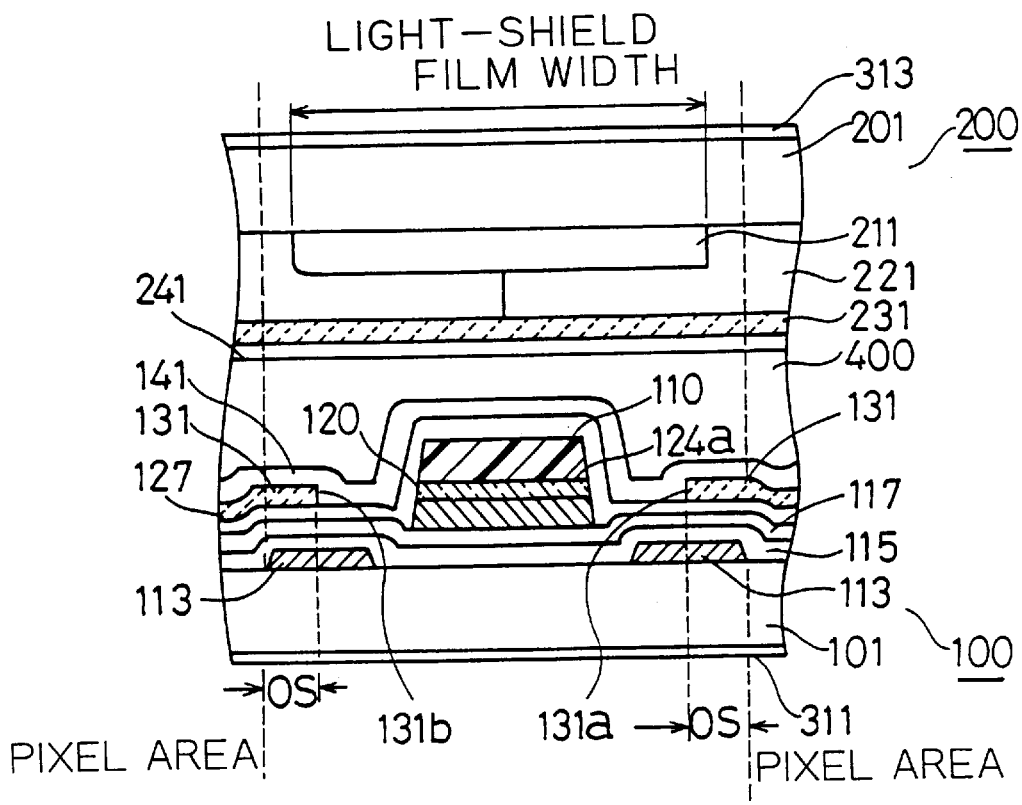
FIG. 18 is a schematic cross-section of the liquid crystal display device taken along line C–C' in FIG. 15.
Figure 19:
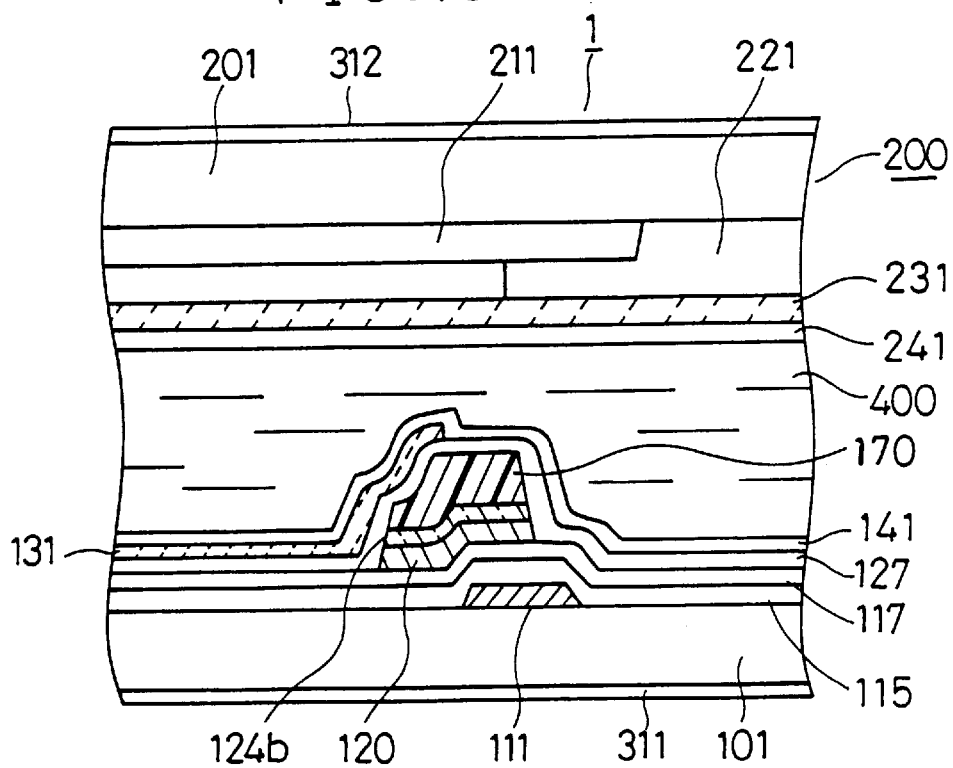
FIG. 19 is a schematic cross-section of the liquid crystal display device taken along line D–D' in FIG. 15.

A still further advantage of this embodiment is that since the signal line (110) coincides in outline with low-resistance semiconductor film (124a) as shown in FIG. 18, it is possible to sufficiently suppress occurrence of capacitive variations between the signal lines (110) and scanning lines (111) even if mask alignment deviations take place during respective patterning steps.

A yet further advantage is that when the signal line (110) is designed to overlap the elongate region (113) of scanning line (111), that is, even when in the structure of FIG. 18 the elongate region (113) being disposed neighboring through the signal line (111) is connected under the signal line (111), since the semiconductor film (12) in addition to respective dielectric films (115), (117) is disposed between the signal line (110) and the elongate region (113) of scanning line (111), any interlayer shorting can be prevented from arising due to static electricity, contaminants during processes or pinholes within respective dielectric films (115), (117), attaining high manufacturing yield. And, with such an arrangement causing the elongate region (113) to be disposed under pixel electrode (131) neighboring to signal line (111), the capacitive coupling between signal line (111) and pixel electrode (131) can be shielded by elongate region (113) lightening adverse interference of the potential at pixel electrode (131) with potential changes of signal line (111). Yet, the semiconductor film (120) as disposed between signal line (111) and dielectric films (115), (117) and low-resistance semiconductor film (124a) are identical in outline with signal line (111). For these reasons, it is permissible that signal line (111) and pixel electrode (131) are located closely to each other attaining further increased aperture ratio.

(Manufacturing Process of Array Substrate)

A method of forming or manufacturing the array substrate (100) will be described in detail with reference to FIGS. 20 through 26.

(1) First Process Step

Figure 20:
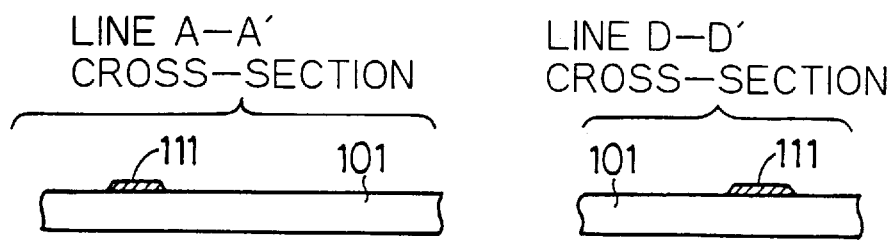
FIG. 20 is a diagram for explanation of a first step in the manufacture of the array substrate shown in FIG. 15.

As shown in FIG. 20, at the view of one cross-section taken along line A–A', an Al—Y alloy film and an Mo film are sequentially deposited by known sputtering techniques on the glass substrate (101) to a thickness of 200 nanometers (nm) and to 30 nm, respectively. The resulting structure is then subject to exposure process using a first mask pattern while development and patterning (first patterning) are carried out, thereby forming 480 scanning lines (111) on the glass substrate (101). Note here that during such patterning of scanning lines (111), elongate regions (113) are also formed simultaneously.

At the position of another cross-section taken along line D–D' also, scanning lines (111) are formed in the same way as mentioned above.

(2) Second Process Step

Figure 21:
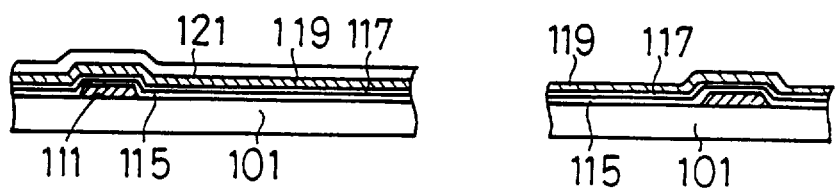
FIG. 21 is a diagram for explanation of a second step in the manufacture of the array substrate shown in FIG. 15.

After completion of the first step, as shown in FIG. 21, at the view of A–A' cross-section, a first gate insulator film (115) made of silicon oxide is deposited using plasma CVD techniques to a thickness of 150 nm; thereafter, a second gate insulator film (117) made of silicon nitride 150 nm thick, a 50-nm thick semiconductor coated film (119) of a-Si:H, and 200-nm thick silicon-nitride channel protective coated film (121) are formed sequentially in this order without exposing them to atmosphere.

At the view of D–D' cross-section, the first gate insulator film (115), second gate insulator film (117) and channel protective coated film (121) are formed in the same way as mentioned above.

(3) Third Process Step

Figure 22:
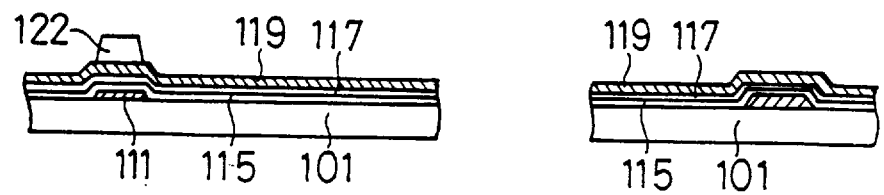
FIG. 22 is a diagram for explanation of a third step in the manufacture of the array substrate shown in FIG. 15.

After completion of the second step, as shown in FIG. 22, at the view of A–A' cross-section, the channel protective coated film (121) is subject using rear-surface exposure techniques to patterning process with the scanning lines (111) being as a mask while the coated film (121) is self-aligned with scanning lines (111), and is then subject to exposure process using a second mask pattern to ensure that it corresponds to each TFT region. Thereafter, development and patterning (second patterning) are performed to fabricate an island-like channel protective film (122).

At the view of D–D' cross-section, the channel protective coated film (121) is removed away by patterning.

(4) Fourth Process Step

Figure 23:
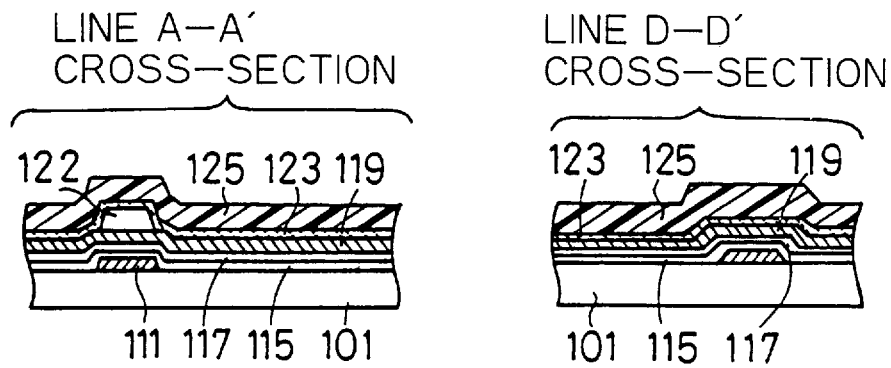
FIG. 23 is a diagram for explanation of a fourth step in the manufacture of the array substrate shown in FIG. 15.

After the third step, as shown in FIG. 23, at the A–A' cross-section position, surface treatment using hydrogen fluoride (HF) solution is applied to the surface of a semiconductor coated film (119) as exposed to obtain good ohmic contacts. Then, a low-resistance semiconductor coated film (123) which is made of n+ type doped amorphous silicon (n+a-Si:H) containing therein phosphorus (P) impurity is deposited by plasma CVD techniques to a thickness of 30 nm. Next, an Mo—W alloy film (125) is deposited thereon using sputtering techniques to a thickness of 300 nm.

At the view of D–D' cross-section also, after deposition of the low-resistance semiconductor coated film (123), an Mo—W alloy film (125) is deposited in the same manner as described above.

(5) Fifth Process Step

Figure 24:
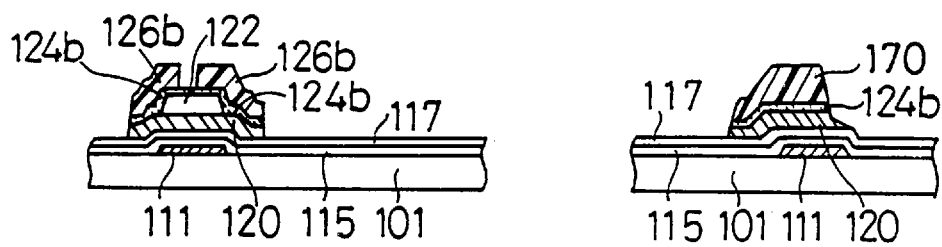
FIG. 24 is a diagram for explanation of a fifth step in the manufacture of the array substrate shown in FIG. 15.

After the fourth step, as shown in FIG. 24, at the view of A–A' cross-section, the resulting structure is subject to exposure and development process using a third mask pattern so that all of the Mo—W alloy film (125), low-resistance semiconductor coated film (123) and semiconductor coated film (119) are patterned by plasma etching techniques at a time by controlling the selective etching rate of the first gate insulator film (115) or second gate insulator film (117) and the channel protective film (122). This is the third patterning process, thereby forming semiconductor film (120), low-resistance semiconductor films (124a), (124b), source electrode (126b), signal line (110), connection node (110a)—see FIG. 15—as integral with signal line (110), and drain electrode (126a) as integral with signal line (110).

At the view of D–D' cross-section, the semiconductor film (120), low-resistance semiconductor film (124b) and Mo—W alloy film (125) are subject to patterning process to make island-like pattern in the same way as mentioned above. As a result, that site of Mo—W alloy film (125) acts as the light shield layer (170). In this case, the light shield layer (170) is arranged so that it does not entirely cover scanning lines (111); it covers them partially.

(6) Sixth Process Step

Figure 25:
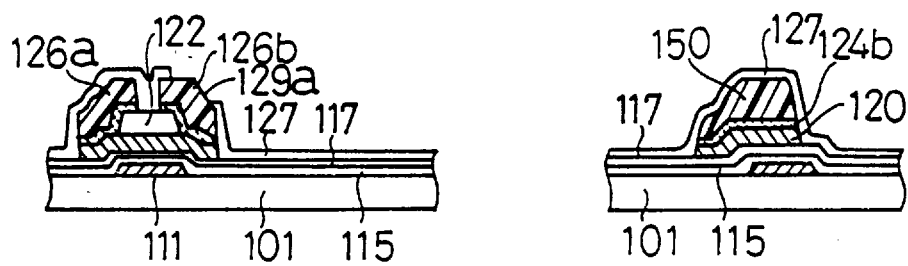
FIG. 25 is a diagram for explanation of a sixth step in the manufacture of the array substrate shown in FIG. 15.

After completion of the fifth step, the interlayer dielectric film (127) of silicon nitride is then deposited on resultant structure to a thickness of 200 nm. At the view of A–A' cross-section, as shown in FIG. 25, exposure and development processes are effected using a fourth mask pattern; next, part of interlayer dielectric film (127) in a region corresponding to the source electrode (126b) is removed away forming a contact hole (129a) using dry etching techniques. Also, part of interlayer dielectric film (127) corresponding to the connection end (110a)—see FIG. 15—of signal line (110) is removed away forming a contact hole (129c) (fourth patterning).

At the view of D–D' cross-section also, the interlayer dielectric film (127) is formed in the same way as described above.

(7) Seventh Process Step

Figure 26:
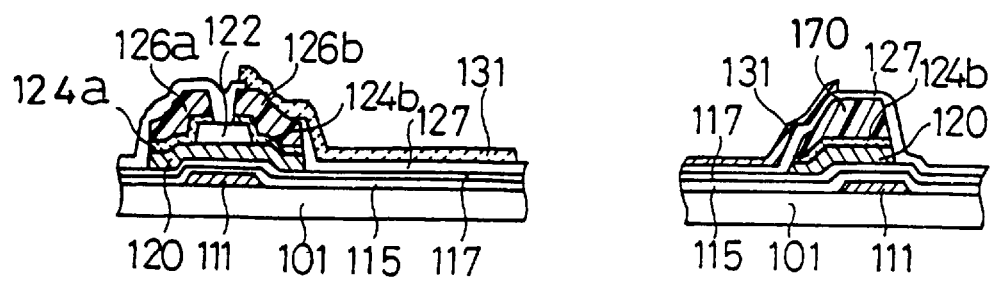
FIG. 26 is a diagram for explanation of a seventh step in the manufacture of the array substrate shown in FIG. 15.

After completion of the sixth step, as shown in FIG. 26, at the view of A–A' cross-section, an ITO film is deposited by sputtering techniques to a thickness of 100 nm. The resulting structure is then subject to exposure, development and patterning using a fifth mask pattern (the fifth patterning), thereby forming pixel electrodes (131)—see FIG. 15.

At the view of D–D' cross-section, the pixel electrode (131) is provided on the interlayer dielectric film (127) in the same way as discussed above. In this case, the light shield layer (170) is arranged across the gap between scanning line (111) and pixel electrode (131).

(Advantage of Second Embodiment)

With the array substrate in accordance with the foregoing illustrative embodiment, the array substrate can be formed or manufactured by use of basically five masks. More specifically, the productivity can be improved with a decreased number of masks used while avoiding a decrease in the manufacturing yield thereof, as a result of locating the pixel electrodes at the uppermost position, and of employing a specific manufacturing method allowing several processes to be done at same step which steps include: patterning the semiconductor coated films as well as the signal lines, source and drain electrodes at a time using the same mask pattern; forming the contact holes for interconnection of each source electrode with its associated pixel electrode and the contact holes for exposure of contact nodes of signal lines and scanning line s.

Further, in the manufacturing process steps mentioned above, it is possible to simultaneously form the pixel electrode (131) and light shield layer (170) at a specific position that overlies one scanning line (111) corresponding to such pixel electrode (131). In this case, any additional manufacturing process steps are not required.

In this embodiment the light shield layer (170) is disposed at the place across the gap between the pixel electrode (131) and one scanning line (111) corresponding to such pixel electrode (131); it may be also possible that the light shield layer (170) is located at the gap between the pixel electrode (131) and a preceding (prestage) or following (poststage) one of the scanning line (111) corresponding to such pixel electrode (131).

(Modification relating to Light-Shield Layer)

Figure 27:
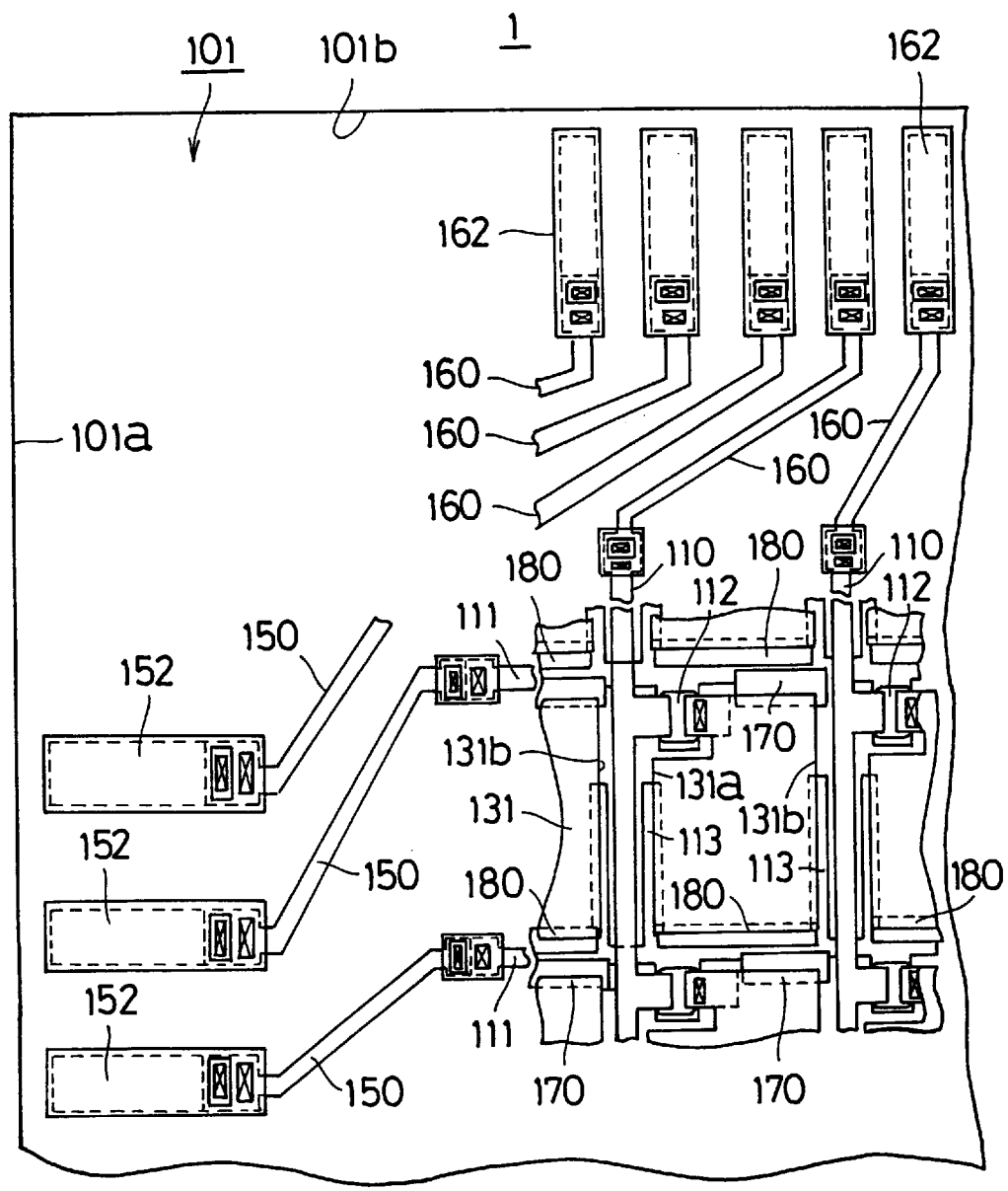
FIG. 27 is a schematic plan view of part of an array substrate in accordance with one modification of the second embodiment.

FIG. 27 shows one modification relating to the light shield layer, which is different from the second embodiment in that a light shield layer (180) is disposed covering the pixel electrode (131), the prestage scanning line (111) of the scanning line corresponding to pixel electrode (131) and the lower edge portion of pixel electrode (131), and that it is electrically insulated from the light shield layer (170). Note here that the light shield layer (170) and light shield layer (180) may alternatively be integrally formed without providing such electrical insulation therebetween.

With such an arrangement, the opening of each pixel area can be defined on the array substrate enabling achievement of high aperture ratio.

(Other Modifications)

The above embodiment is drawn to the case where the semiconductor films are made of a-Si:H; obviously, these may alternatively be polycrystalline silicon films. Also, driver circuitry may be arranged in the peripheral region in a manner that it is integrated therewith.

Further, in cases where the pixel electrodes are located over the signal lines and/or scanning lines with part of them overlapping such lines, an appropriate shield electrode made of a metallic film may be additionally provided between at least the pixel electrode and an associative signal line while dielectric films are used for electrical insulation therebetween. When this is done, it is possible to reduce adverse influence of potential variations on signal lines upon pixel electrodes.

Third Embodiment

A description will now be given of an LCD device (1) in accordance with a third embodiment of the invention in connection with FIGS. 28 to 38.

Figure 29:
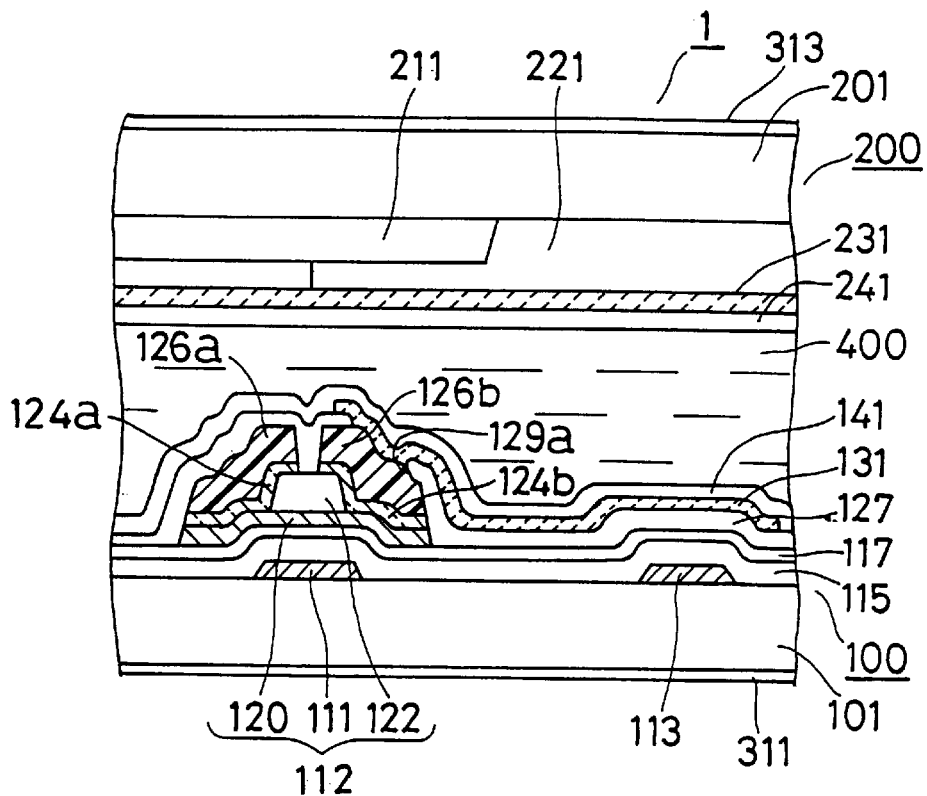
FIG. 29 is a schematic cross-section of the liquid crystal display device taken along line A–A' in FIG. 28.

As shown in FIG. 29, the LCD device (1) has an array substrate (100), an opposed substrate (200), and a twisted nematic (TN) liquid crystal held therebetween with an orientation film (141) being laid between the liquid crystal and array substrate (100) and with another orientation film (241) between liquid crystal and opposed substrate (200). These orientation films (141), (241) are made of polyimide resin. Also, polarization plates (311), (313) are adhered to the outer surfaces of array substrate (100) and opposed substrate (200), respectively.

The array substrate (100) includes 480 scanning lines (111) made of Al—Y alloy as disposed on a glass substrate (101), storage capacitor lines (113) same in material and in process as scanning lines (111), a first gate insulator film (115) made of a silicon oxide film as disposed on scanning lines (111) and storage capacitor lines (113), and second gate insulator film (117) made of a silicon nitride deposited thereon.

The array substrate includes 480 Al—Y alloy scanning lines (111) as disposed on the glass substrate (101); one end of each scanning line (111) is taken out to extend toward one edge (101a) side of the glass substrate (101), and is electrically connected through a slant wiring line section (150) to a corresponding one of scanning line connection pads (152). Note here that the slant wiring line sections (150) and scanning line pads (152) may be substantially the same as those of the first embodiment both in structure and in manufacturing process step.

The array substrate (100) also includes 1,920 signal lines (110) made of Mo—W alloy, which lines extend to intersect the scanning lines (111) at substantially right angles on the glass substrate (101). Each signal line (110) is taken out to run toward the other edge (101b) side of the glass substrate (101), forming a corresponding signal line pad (162) through a slant wiring line section (160). Note that the slant wiring line section (160) and signal line pad (162) may be the same in structure to those of the first embodiment while employing the same manufacturing process.

A TFT (112) is disposed near each of the crosspoints of the scanning lines (111) and signal lines (110). Also, a pixel electrode (131) of this TFT (131) is disposed over the scanning line (111) and signal line (110) with an interlayer dielectric film (127) being provided therebetween. This interlayer dielectric film (127) may be an inorganic dielectric film made of silicon nitride; more preferably, the interlayer dielectric film is constituted from a multi-layer film employing a combination of such inorganic dielectric film and organic resin coated film thereby further improving the surface flatness and interlayer dielectricity.

An opposed electrode (200) opposing the array substrate (100) is disposed on the glass substrate (201), and includes a matrix-shaped light shielding film (211) made of a chosen resin material which functions to block any incoming light rays by way of the TFT (121) region and gap spacings between the pixel electrode (131) and signal lines (110) and between the pixel electrode (131) and scanning lines (111). A color filter (221) having three color components of red (R), green (G) and blue (B) is disposed in a certain region corresponding to the pixel electrode (131). Provided on this is another opposed electrode (231) made of a transparent conductive material.

(Structure of TFT Region)

The structure of TFT (112) is as follows.

On the array substrate (100), as shown in FIG. 29, the pixel electrode (131) is disposed overlying a corresponding scanning line (111) with the lamination of first gate insulator film (115), second gate insulator film (117) and interlayer dielectric film (127) being laid therebetween; the pixel electrode is also disposed overlying an associative signal line (110) with interlayer dielectric film (127) being sandwiched therebetween. Accordingly, even when the pixel electrode (131) is located to sufficiently closer to such signal line (110) or scanning line (111), any electrical short-circuiting will no longer be occurred enabling achievement of high manufacturing yield while permitting high-resolution/high-aperture ratio design schemes. To be more specific, it may be permissible that pixel electrode (131) overlies either signal line (110) or scanning line (111) as necessary.

Figure 30:
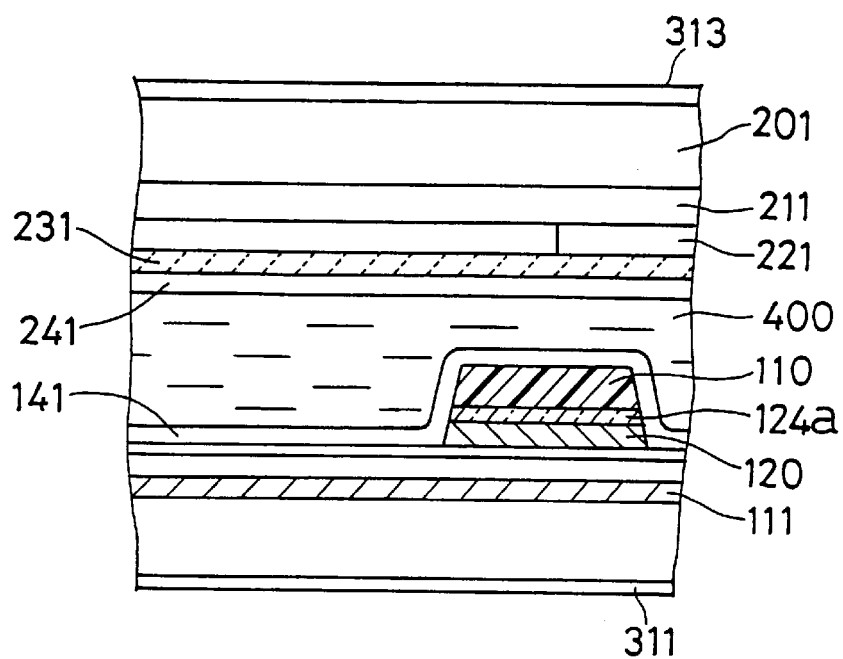
FIG. 30 is a schematic cross-section of the liquid crystal display device taken along line B–B' in FIG. 28.

Yet, as shown in FIG. 30, the signal line (110) is exactly identical in outline to a low-resistance semiconductor film (124a) and semiconductor film (120). More specifically, not only the first and second gate insulator films (115), (117) but also the low-resistance semiconductor film (124a) and semiconductor film (120) are laminated at the individual one of crosspoints of signal lines (110) and scanning lines (111). Due to this, even on occasions where mask deviations take place during patterning process steps, the capacitance can remains unchanged between the signal lines (110) and scanning lines (111), thereby suppressing variations or fluctuations in scanning-line capacitance or in signal-line capacitance among devices manufactured. Moreover, this may suppress or eliminate interlayer shorting otherwise occurring due to static electricity at crosspoints of signal lines (110) and scanning lines (111), mixture of contaminants during process steps, or presence of pinholes in respective dielectric films (115), (117), thus enabling provision of higher yield of production. The same goes with the relation between the signal line (110) and storage capacitor line (113).

(Wiring-Line Structure of Storage capacitor Line)

It is required that each storage capacitor line (113) be uniformly applied with voltages in the same manner as for the opposed electrodes for example. To attain this, this embodiment employs a specific arrangement as set forth below. The wiring-line structure thereof is now explained with reference to FIGS. 28 and 31.

As has discussed previously, the storage capacitor line (113) is made of the same material as that used for the scanning lines (111)—e.g. Al—Y alloy—and is in substantially parallel with scanning lines (111).

Figure 28:
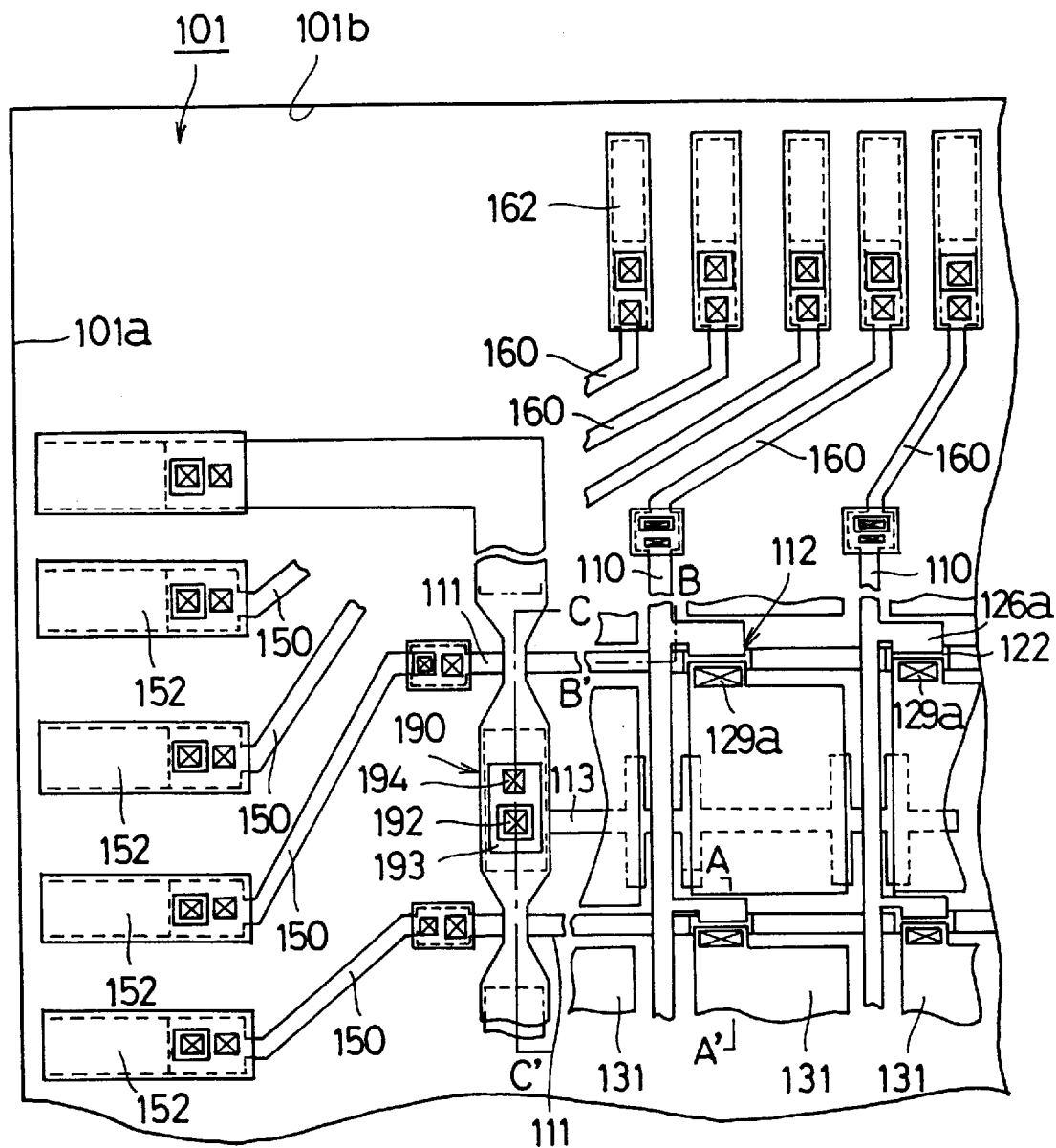
FIG. 28 is a schematical plan view of part of an array substrate in accordance with a third embodiment of the invention.
Figure 31:
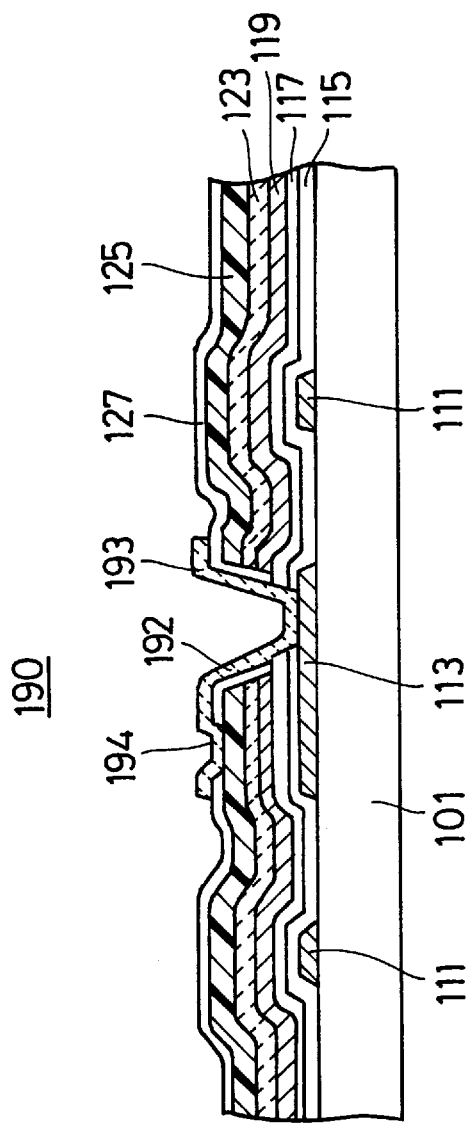
FIG. 31 is a schematic cross-section of the liquid crystal display device taken along line C–C' in FIG. 28.

In view of the above, as shown in FIG. 28, a storage capacitor-line connecting section (190) is formed so that it is at right angles to the direction of an associative storage capacitor line (113) at one end portion of each storage capacitor line (113). The structure of this storage capacitor-line coupler section (190) is illustrated in FIG. 31.

The structure of this storage capacitor-line connecting section (190) will now be described below.

On the storage capacitor line (113) and scanning line (111) which are in parallel with each other, a first gate insulator film (115) made of silicon oxide and an overlying second gate insulator film (117) of silicon nitride are disposed and laminated respectively. Provided on these double-layered dielectric films (115), (117) are a lamination of semiconductor coated film (119) almost perpendicular to the storage capacitor line (113) and scanning lines (111), a low-resistance semiconductor coated film (123), and a bundling lead (125) made of Mo—W alloy film that is the same in material and in process as signal lines (110). And, a first contact hole (191) is formed which partially penetrates two dielectric films (115), (117), semiconductor coated film (119), low-resistance semiconductor coated film (123), bundling lead (125) and interlayer dielectric film (127) rendering part of storage capacitor line (113) exposed. Also, a second contact hole (192) making a pair with the first contact hole (191) is disposed near first contact hole (191) along the wiring-line direction of bundling lead (125), for removal of part of interlayer dielectric film (127) causing part of bundling lead (125) to be exposed. The storage capacitor line (113) made of ITO which is the same in material and process as pixel electrodes (131) is disposed and laminated in a region from a pair of first contact hole (191) to second contact hole (192), whereby each storage capacitor line (113) and its associated bundling lead (125) are electrically connected together by a storage capacitor-line connection layer (193).

In the same manner as in scanning line pads (152), the end portion of each storage capacitor-line coupler section (190) is taken out toward one edge (101a) side of the glass substrate (101) forming a storage capacitor-line connection pad (194). This storage capacitor line pad (194) may be similar in structure to the scanning line pads (152) or signal line pads (162).

Upon application of a voltage to the storage capacitor line pad (194), all storage capacitor lines (113) can be held at the same potential. In addition, fabrication of storage capacitor-line connecting section (190) may be carried out simultaneously with the manufacture of array substrate (100) to be later described; it is thus avoidable that the manufacturing process is complicated unnecessarily.

In this embodiment the ITO storage capacitor line (113) is disposed and laminated exclusively between the pair of first contact hole (191) and second contact hole (192); however, it may alternatively be designed to extend along the bundling lead (125). If this is the case, any failure of electrical interconnection can be prevented from occurring at bundling lead (125).

(Manufacturing Process of Array Substrate)

A method of forming or manufacturing the array substrate (100) will be described in detail with reference to FIGS. 32 to 38.

(1) First Process Step

Figure 32:
FIG. 32 is a diagram for explanation of a first step in the manufacture of the array substrate shown in FIG. 28.

As shown in FIG. 32, an Al—Y alloy film and an Mo film are sequentially deposited by known sputtering techniques on the glass substrate (101) to a thickness of 200 nanometers (nm) and to 30 nm, respectively. The resulting structure is then subject to exposure process using a first mask pattern while development and patterning (first patterning) are carried out thereby forming 480 scanning lines (111) and 480 storage capacitor lines (113).

(2) Second Process Step

Figure 33:
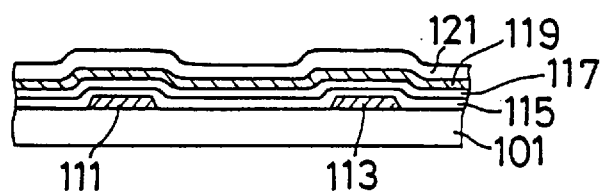
FIG. 33 is a diagram for explanation of a second step in the manufacture of the array substrate shown in FIG. 28.

After completion of the first step, as shown in FIG. 33, a first gate insulator film (115) made of silicon oxide is deposited using plasma CVD techniques to a thickness of 150 nm; thereafter, a second gate insulator film (117) made of silicon nitride 150 nm thick, a 50-nm thick semiconductor coated film (119) made of a-Si:H, and a 200-nm thick silicon-nitride channel protective coated film (121) are formed sequentially in this order without exposing them to atmosphere.

(3) Third Process Step

Figure 34:
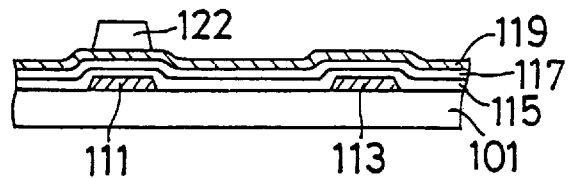
FIG. 34 is a diagram for explanation of a third step in the manufacture of the array substrate shown in FIG. 28.

After the second step, as shown in FIG. 34, the channel protective coated film (121) is subject using rear-surface exposure techniques to patterning process with the scanning lines (111) being as a mask while the coated film (121) is self-aligned with scanning lines (111), and is then subject to exposure process using a second mask pattern to ensure that it corresponds to each TFT region. Thereafter, development and patterning (second patterning) are performed to fabricate an island-like channel protective film (122).

(4) Fourth Process Step

Figure 35:
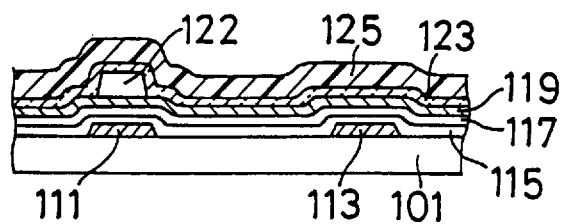
FIG. 35 is a diagram for explanation of a fourth step in the manufacture of the array substrate shown in FIG. 28.

After the third step, as shown in FIG. 35, surface treatment using hydrogen fluoride (HF) solution is applied to the exposed region of surface of a semiconductor coated film (119) to obtain good ohmic contacts. Then, a low-resistance semiconductor coated film (123) which is made of n+ type doped amorphous silicon (n+a-Si:H) conductivity containing therein phosphorus (P) impurity is deposited by plasma CVD techniques to a thickness of 30 nm. Next, an Mo—W alloy film (125) is deposited thereon using sputtering techniques to a thickness of 300 nm.

(5) Fifth Process Step

Figure 36:
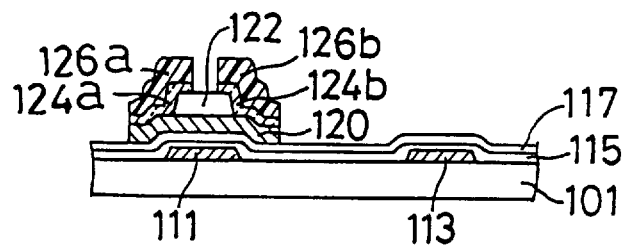
FIG. 36 is a diagram for explanation of a fifth step in the manufacture of the array substrate shown in FIG. 28.

After the fourth step, as shown in FIG. 36, the resulting structure is subject to exposure and development process using a third mask pattern so that all of the Mo—W alloy film (125), low-resistance semiconductor coated film (123) and semiconductor coated film (119) are patterned (third patterning) by plasma etching techniques at a time while controlling the selective etching rate of the second gate insulator film (117) and the channel protective film (122), thereby forming semiconductor film (120), low-resistance semiconductor films (124a), (124b), source electrode (126b), signal line (110), connection node (110a)—see FIG. 1—integral with signal line (110), and drain electrode (126a) integral with signal line (110).

During such process, a bundling lead (125) constituting the storage capacitor connecting section (190) as described previously is patterned; at the same time, an opening (not shown) is formed by removing part of the lamination consisting of the bundling lead (125) on storage capacitor line (113), low-resistance semiconductor coated film (123) and semiconductor coated film (119), which opening corresponds to a first contact hole (191) for electrical connection of storage capacitor line (113) and bundling lead (125).

(6) Sixth Process Step

Figure 37:
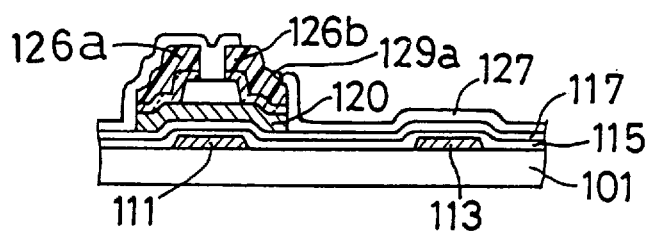
FIG. 37 is a diagram for explanation of a sixth step in the manufacture of the array substrate shown in FIG. 28.

After the fifth step, the interlayer dielectric film (127) of silicon nitride is then deposited on resultant structure to a thickness of 200nm. Then, as shown in FIG. 37, exposure and development processes are effected using a fourth mask pattern; next, part of interlayer dielectric film (127) in a region corresponding to the source electrode (126b) is removed away forming a contact hole (129a) using dry etching techniques (fourth patterning).

Simultaneously, part of the interlayer dielectric film (127) corresponding to the aforesaid opening is removed away causing the storage capacitor line (113) to be partly exposed for formation of the first contact hole (191), while forming a second contact hole (192) by partial removal of the interlayer dielectric film (127) letting part of bundling lead (125) be exposed in the vicinity of first contact hole (191).

(7) Seventh Process Step

Figure 38:
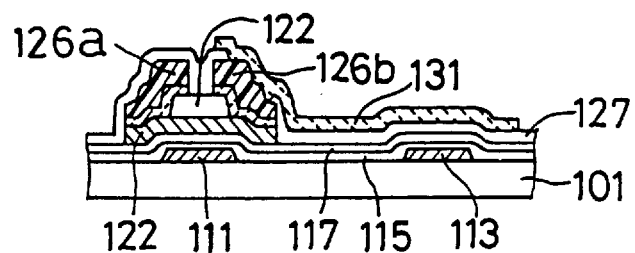
FIG. 38 is a diagram for explanation of a seventh step in the manufacture of the array substrate shown in FIG. 28.

After completion of the sixth step, as shown in FIG. 38, an ITO film is deposited by sputtering techniques to a thickness of 100 nm. The resulting structure is then subject to patterning treatment by exposure, development and dry etching techniques using a fifth mask pattern (the fifth patterning), thereby forming pixel electrodes (131).

Simultaneously, a storage capacitor interconnection layer (193) is formed which is for connection of the storage capacitor line (113) and bundling lead (125) through the first contact hole (191) and second contact hole (192).

(Advantage of Third Embodiment)

With the array substrate in accordance with the foregoing illustrative embodiment, the array substrate can be formed or manufactured by use of basically five masks. More specifically, an optimized process can be provided for achievement of the conflicting requirements—namely, preventing a reduction in manufacturing yield by miniaturizing any possible step-like differences as caused in wiring lines, and improving the productivity with a decreased number of masks employed therein—as a result of locating the pixel electrodes at the uppermost position, and of employing a specific manufacturing method allowing several process steps to be done simultaneously which steps include: patterning the semiconductor coated films as well as the signal lines, source and drain electrodes at a time using the same mask pattern used therefor; forming the contact holes for interconnection of each source electrode with its associated pixel electrode and the contact holes for exposure of contact nodes of signal lines and scanning line s.

(Other Possible Modifications)

In the illustrative embodiment discussion is directed to the case where the semiconductor film is made of a-Si:H; alternatively, it may also be polycrystalline silicon or the like. Driver circuitry may be formed integrally with the array board at the peripheral region.

Also, where the pixel electrodes are disposed over the signal lines and/or scanning lines with part of the former overlapping the latter, an appropriate shield electrode made of a metallic film may be additionally provided between at least the pixel electrode and an associative signal line while dielectric films are used for electrical insulation therebetween. If this is the case, it becomes possible to reduce adverse influence of potential variations on signal lines upon pixel electrodes.

It should be noted that any one of the aforementioned embodiments is the optical transmissive LCD device, and that discussions are directed to the case where the pixel electrodes are made of a transparent conductive film, such as ITO, for example. Due to this, electrical interconnection between the lower-layer wiring line section and upper-layer wiring line section is attained by way of the connection layer made of ITO as disposed through a pair of contact holes in each embodiment. In view of the fact that this ITO is relatively high in resistance, it may be desirable that the distance or interval between such paired contact holes is as short as possible; preferably less than 20 micrometers, for example; more preferably, less than 15 micrometers. Note here that on occasions where this connection layer and pixel electrodes are to be fabricated at separate process steps, it may be possible to employ low-resistance materials therefor. If the LCDs are of the reflection type, the distance between such paired contact holes need not be limited so strictly because pixel electrodes can in such case be comprised of low-resistance materials such as aluminum.

As the liquid crystal layer, any one of several kinds of materials other than the TN liquid crystal, such as polymer distributed liquid crystal, ferrodielectric liquid crystal, antiferrodielectric liquid crystal, or the like.

We claim:

1. An array substrate for a display device having a scanning line on a substrate, a thin film transistor having a first insulator film on said line, a semiconductor film thereon, and source and drain electrodes electrically connected to said semiconductor film, a signal line as taken out of the drain electrode to extend substantially perpendicularly to said scanning line, and a pixel electrode electrically connected to the source electrode, comprising a scanning-line takeout section being provided at a scanning-line terminal section located at periphery of said substrate, for taking out said scanning line, wherein said scanning-line takeout section has:
   a first conductive layer same in material as said scanning line, and a second conductive layer being same in material as the signal line and being provided on said first conductive layer with an insulative layer being sandwiched therebetween, and said first conductive layer and said second conductive layer being electrically connected together by a connection layer same in material as said pixel electrode.

2. An array substrate for a display device having a scanning line on the substrate, a thin film transistor having a first insulator film on said line, a semiconductor film thereon, and source and drain electrodes electrically connected to said semiconductor film, a signal line as taken out of the drain electrode to extend substantially perpendicularly to said scanning line, and a pixel electrode electrically connected to the source electrode, comprising a signal-line takeout section for taking out the signal line as provided at a signal-line terminal section located at periphery of said substrate, wherein said signal-line takeout section has:
  a first conductive layer same in material as said scanning line, and a second conductive layer being same in material as the signal line and being provided on said first conductive layer with an insulative layer being sandwiched therebetween, and
  said first conductive layer and said second conductive layer being electrically connected together by a connection layer same in material as said pixel electrode.

3. An array substrate for a display device comprising a scanning line on a substrate, a thin film transistor having a first insulator film on said line, a semiconductor film thereon, and source and drain electrodes electrically connected to said semiconductor film, a second insulator film on said thin film transistor, a signal line extending substantially perpendicularly to said scanning line as electrically connected through said second insulator film to the drain electrode, a pixel electrode electrically connected through said second insulator film to the source electrode, a signal line terminal section electrically connected through a signal line takeout section to said signal line, and a scanning line terminal section electrically connected through a scanning line takeout section to said scanning line, wherein said signal line terminal section and scanning line terminal section comprise a first conductive layer same in material as said scanning line, and a second conductive layer same in material as said pixel electrode and being disposed on said first conductive layer.

4. The array substrate according to claim 3, wherein said signal line terminal section and scanning line terminal section each comprises a first conductive layer same in material as said scanning line, and a third conductive layer same in material as said signal line and being provided on said first conductive layer with said first insulator film being laid therebetween, and that said first conductive layer and said third conductive layer are electrically coupled by said second conductive layer to each other.

* * * * *